United States Patent
Kondoh et al.

(10) Patent No.: US 7,892,975 B2
(45) Date of Patent: *Feb. 22, 2011

(54) METHOD FOR SELECTIVELY FORMING ELECTRIC CONDUCTOR AND METHOD FOR MANUFACTURING SEMICONDUCTOR DEVICE

(75) Inventors: Eiichi Kondoh, Kofu (JP); Michiru Hirose, Kasugai (JP); Hitoshi Tanaka, Kawasaki (JP); Masayuki Satoh, Kasaoka (JP); Hisashi Yano, Jyoyo (JP); Masaki Yoshimaru, Hachioji (JP)

(73) Assignee: Semiconductor Technology Academic Research Center, Yokohama-shi (JP)

( * ) Notice: Subject to any disclaimer, the term of this patent is extended or adjusted under 35 U.S.C. 154(b) by 273 days.

This patent is subject to a terminal disclaimer.

(21) Appl. No.: 11/688,684

(22) Filed: Mar. 20, 2007

(65) Prior Publication Data

US 2008/0233705 A1  Sep. 25, 2008

(51) Int. Cl.
  *H01L 21/441* (2006.01)
(52) U.S. Cl. .................. 438/675; 257/E21.477
(58) Field of Classification Search ......... 438/674–678; 257/E21.477–E21.479
See application file for complete search history.

(56) References Cited

U.S. PATENT DOCUMENTS 6,653,236 B2 * 11/2003 Wai et al. ................ 438/687
2006/0189071 A1 * 8/2006 Grant ...................... 438/243
2006/0223312 A1 * 10/2006 Yonker et al. ............ 438/674
2008/0032503 A1 * 2/2008 Thompson ............... 438/681

OTHER PUBLICATIONS

Claims filed Aug. 27, 2007 in U.S. Appl. No. 11/845,615.*
Kondoh, E., "Semiconductor Downsizing Processing Using Supercritical CO2," Clean Technology, Japan Industrial Publishing Co., Ltd., Jun. 2004, pp. 55-58.
Kobayashi, Y., "Back-End Process Technology for 45 nm," Semiconductor FPD World, Aug. 2004, pp. 44-47.

* cited by examiner

*Primary Examiner*—Matthew S Smith
*Assistant Examiner*—Daniel Shook
(74) *Attorney, Agent, or Firm*—Christensen O'Connor Johnson Kindness PLLC

(57) ABSTRACT

A method for selectively forming an electric conductor, the method including disposing a processing target and a metal compound in an atmosphere including a supercritical fluid, the processing target having formed thereon at least one recess for providing an electric conductor, the metal compound including a metal serving as a main component of the electric conductor, and dissolving at least part of the metal compound in the supercritical fluid, selectively introducing the metal compound dissolved in the supercritical fluid into the recess in contact with a surface of the processing target, and coagulating in the recess the metal compound introduced into the recess to precipitate the metal from the metal compound, and coagulating the metal precipitated in the recess, thereby providing the electric conductor in the recess.

24 Claims, 12 Drawing Sheets

| Amount of organic metal complex [mg/cc] | 25 | 5 | 5 |
|---|---|---|---|
| $H_2$ additive pressure [MPa] | 1 | 1 | 0.2 |
| Whole pressure [MPa] | 12 | | |
| Processing temperature [°C] | 250 | | |
| Processing [min] | 15 | | |

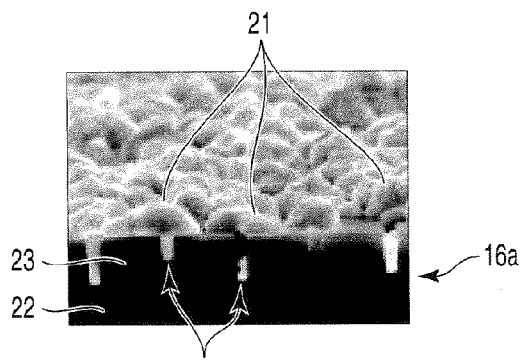
F I G. 10A
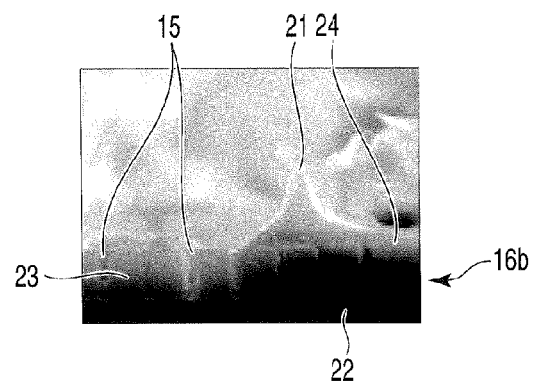
F I G. 10B
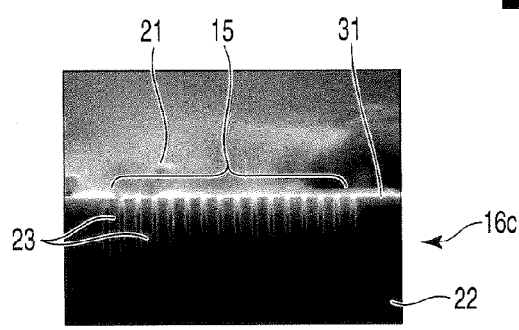
F I G. 10C
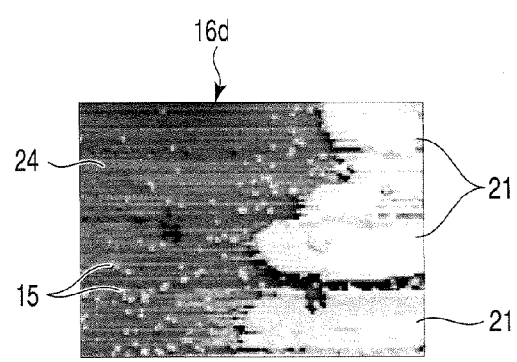
F I G. 10D

| Amount of Ru(Cp)$_2$ | 50 | 10 | 10 |
|---|---|---|---|
| H$_2$ additive pressure [MPa] | 1 | 1 | 0.2 |
| Whole pressure [MPa] | 12 | | |
| Processing temperature [°C] | 250 | | |
| Pressure time [min] | 15 | | |

FIG. 12

| | SiO$_2$ | SiO$_2$ (Au coat) | TiN/SiO$_2$ | TiN/SiO$_2$ (Au coat) |
|---|---|---|---|---|
| 50mg 1MPa | Degree of deposition ○  Shape sensitivity △ | Degree of deposition ○  Shape sensitivity ○ | Degree of deposition ○ | Degree of deposition ○ |
| 10mg 1MPa | Degree of deposition ○  Shape sensitivity ○ | Degree of deposition △  Shape sensitivity × | Degree of deposition ×  Shape sensitivity × | Degree of deposition ○  Shape sensitivity ○ |
| 10mg 0.2MPa | Degree of deposition × | Degree of deposition ○  Shape sensitivity × | Degree of deposition × | Degree of deposition ○ |

FIG. 13

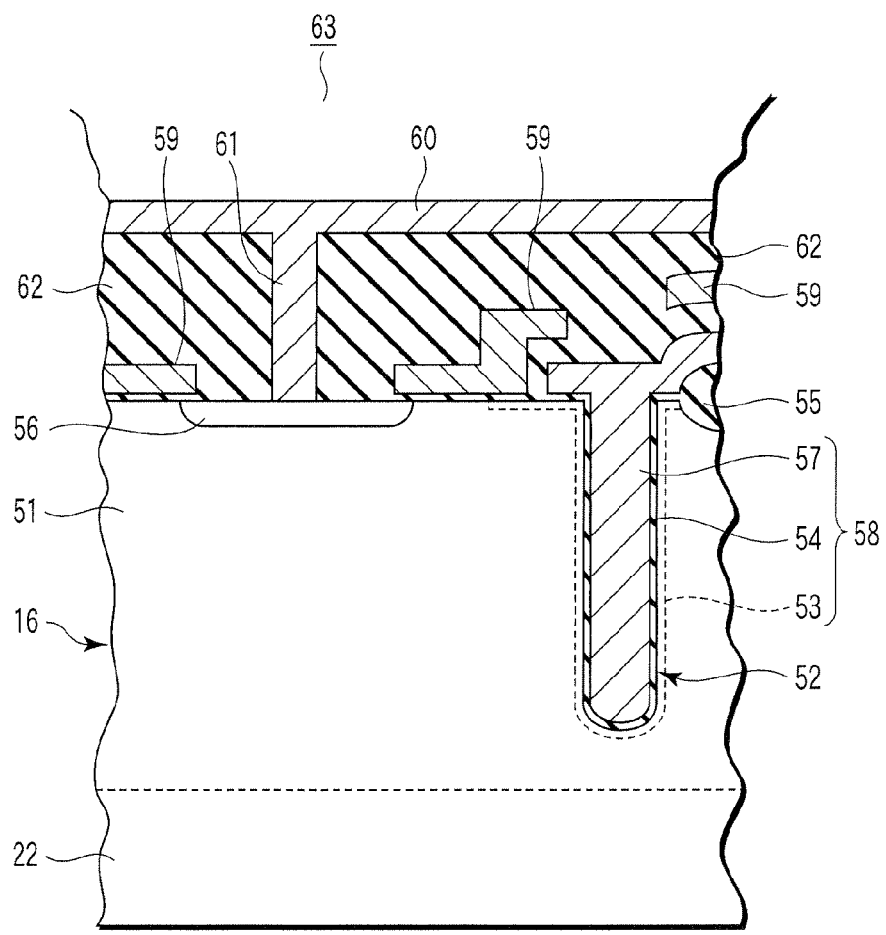
F I G. 15

METHOD FOR SELECTIVELY FORMING ELECTRIC CONDUCTOR AND METHOD FOR MANUFACTURING SEMICONDUCTOR DEVICE

BACKGROUND OF THE INVENTION

1. Field of the Invention

The present invention relates to a technique of selectively providing an electric conductor at a predetermined site, and particularly to: a method for selectively forming an electric conductor, the method capable of selectively providing an electric conductor by using an supercritical fluid inside a site such as a microscopic hole (pore) with a high aspect ratio, a recess, or a trench (groove); and a method for manufacturing a semiconductor device, the method capable of providing a microscopic wire, plug or electrode by using the selectively forming method.

2. Description of the Related Art

In order to manufacture a microelectronics element such as an integrated circuit, it is mandatory to perform a step of compactly filling a metal inside small holes such as a microscopic groove for forming a wire with a high aspect ratio, a pore for forming a plug or a recess for forming an electrode. In general, such a step utilizes a phenomenon that a metal thin film is deposited on a surface of a substrate or an insulation film on which a microscopic opening has been formed, whereby the metal thin film goes into (coats) the inside of a microscopic pore through the microscopic opening. In other words, an embedding (filling up) technique referred to as a so-called damascene process is generally employed for embedding a metal thin film inside a microscopic pore.

However, in the conventional embedding technique, the metal thin film is deposited from above the microscopic pore. Thus, in the case where the metal thin film insufficiently goes into the inside of the microscopic pore, voids are generated in the microscopic pore. Further, in the case where the metal thin film goes into the microscopic pore is extremely small in amount, it may cause disconnection (failure) of embedded wires or the like. In addition, in a general embedding technique, it is sufficient if a metal is filled only inside a microscopic pore, and there is no need for a metal thin film outside the microscopic pore. Thus, after the step of embedding a metal into the microscopic pore has been terminated, there is a need for a step of removing the metal thin films deposited on a substrate or an insulation film in accordance with a CMP technique or the like. In other words, such a general embedding technique is prone to wastefully use a material for forming a film and the number of steps easily increases. Thus, this technique is uneconomical and not efficient. Such a problem can be solved if a technique capable of selectively filling a metal into a microscopic pore is developed. As one of such techniques, there is exemplified a technique referred to as a so-called selective deposition technique. This selective deposition technique is attempted using a CVD technique, for example.

However, the CVD technique generally requires a high process temperature including a film forming temperature and has a high process temperature dependency. In addition, the CVD technique considerably consumes materials or energy. Thus, the CVD technique has a small process margin. In addition, the CVD technique entails a problem that entry of impurities is probe to occur. Further, a so-called metal CVD technique of forming a metal film in accordance with the CVD technique utilizes undercoat dependency, and thus, materials used for a film to be formed and an undercoat layer are limited. In the metal CVD technique, a metal film can be substantially formed only on an electric conductor such as a metal. In particular, in a so-called organic metal CVD technique using a liquid material, the liquid material is generally unstable, and a process margin is smaller.

In addition, a PVD technique is exemplified as a general method for forming a thin film other than the CVD technique. However, the PVD technique entails a problem that a stepped coating property is low in comparison with the CVD technique. Thus, if an attempt is made to embed (fill up) a microscopic hole while a metal thin film is formed in accordance with the PVD technique, there is a high anxiety that an embedding (filling up) failure occurs. As a result, there is a high anxiety that disconnection (failure) of embedded wires or the like occurs. The PVD technique cannot carry out a selective deposition technique because of its principle. Further, the PVD technique and the CVD technique are low in process density, and thus, entail a problem that throughput is slow.

Further, in recent years, a variety of electronic devices including semiconductor devices have been downsized significantly. Concurrently, microelectronics elements such as integrated circuits have been further miniaturized and highly integrated. In the miniaturized integrated circuit, its internal structure such as wires, plugs, and electrodes are more complicated, more three-dimensional, or finer in comparison with conventional ones. In order to efficiently form the thus structured wires, plugs, or electrodes, for example, it is mandatory to develop a technique capable of efficiently forming wires such as so-called vertical nano-wires. In other words, in order to manufacture a further miniaturized integrated circuit, it is mandatory to develop a technique capable of compactly and efficiently filling a metal inside a groove for forming a wire with high fineness and a high aspect ratio and a pore for forming a plug, or alternatively, a recess for forming an electrode.

However, as described previously, the conventional damascene technique or subtraction technique using the CVD technique or the PVD technique is easily complicated in steps and the number of steps is hardly reduced. Thus, productivity is low and production costs are hardly restrained. In addition, embedding property or filling up property is seemingly limited. In other words, in the conventional microscopic pore embedding technique, it is thought very difficult to keep track with further microscopic or highly integrated circuit. In order to solve such problems associated with the conventional microscopic pore embedding technique, there has been recently proposed an embedding technique referred to as a supercritical chemical deposition technique of forming a metal film and selectively embedding a microscopic pore by using a so-called supercritical fluid. This supercritical chemical deposition technique is described in Clean Technology (June 2004, Japan Industrial Publishing Co., Ltd.; pages 55 to 58) or Semiconductor FPD World (August 2004, pp. 44 to 47), for example. However, research and development of this supercritical chemical deposition technique has just started recently, and the technique has not yet reached a practical stage capable of enduring a step of manufacturing an integrated circuit or a semiconductor device as a practical product.

BRIEF SUMMARY OF THE INVENTION

According to an aspect of the invention, there is provided a method for selectively forming an electric conductor, the method comprising: disposing a processing target and a metal compound in an atmosphere including a supercritical fluid, the processing target having formed thereon at least one recess for providing an electric conductor, the metal compound including a metal serving as a main component of the electric conductor, and dissolving at least part of the metal compound in the supercritical fluid; selectively introducing the metal compound dissolved in the supercritical fluid into the recess in contact with a surface of the processing target, and coagulating in the recess the metal compound introduced into the recess to precipitate the metal from the metal compound; and coagulating the metal precipitated in the recess, thereby providing the electric conductor in the recess.

According to another aspect of the invention, there is provided a method for manufacturing a semiconductor device, the method comprising: disposing, in an atmosphere including a supercritical fluid, a semiconductor substrate having formed thereon at least one recess for providing an electric conductor on at least one of a substrate main body and an insulation film provided above the substrate main body and a metal compound including a metal serving as a main component of the electric conductor, and dissolving at least part of the metal compound in the supercritical fluid; selectively introducing the metal compound dissolved in the supercritical fluid into the recess in contact with a surface of the semiconductor substrate, and coagulating in the recess the metal compound introduced into the recess to precipitate the metal from the metal compound; and coagulating the metal precipitated in the recess, thereby providing the electric conductor in the recess.

BRIEF DESCRIPTION OF THE SEVERAL VIEWS OF THE DRAWING

FIGS. 10A, 10B, 10C, and 10D are sectional views and plan views showing, by using a SEM photograph, the vicinity of an electric conductor formed in accordance with the method for selectively forming an electric conductor according to the second embodiment;

FIG. 12 is a view tabulating processing conditions for forming electric conductors shown in FIGS. 9A to 9D, FIGS. 10A to 10D, and FIGS. 11A to 11D;

FIG. 13 is a view classifying and tabulating results obtained by the method for selectively forming an electric conductor according to the second embodiment for each processing condition shown in FIG. 12;

FIG. 15 is a sectional view showing a method for manufacturing a semiconductor device according to a fourth embodiment.

DETAILED DESCRIPTION OF THE INVENTION

Now, embodiments according to the present invention will be described with reference to the accompanying drawings.

First Embodiment

First, a first embodiment according to the present invention will be described with reference to FIGS. 1 to 8. The present embodiment describes a technique of selectively providing an electric conductor inside at least one recess with high fineness and a high aspect ratio by utilizing a dissolving power equivalent to that of a liquid included in a supercritical fluid; high diffusion property equivalent to a gas; a surface tension almost equal to zero; and high density. In this technique, a supercritical fluid is utilized as a solvent and a metal compound serving as a material for an electric conductor is dissolved as a solute in the supercritical fluid. In addition, in this technique, a metal compound serving as a material for an electric conductor is selectively introduced into at least one recess in a self-aligned manner by utilizing a structure or a physical shape of an undercoat instead of a material for an undercoat on which an electric conductor is provided. Now, a specific and detailed description will be given here.

First, referring to FIGS. 1 and 2, a description will be given with respect to an apparatus 1 for selectively forming an electric conductor according to the present embodiment.

Figure 1:
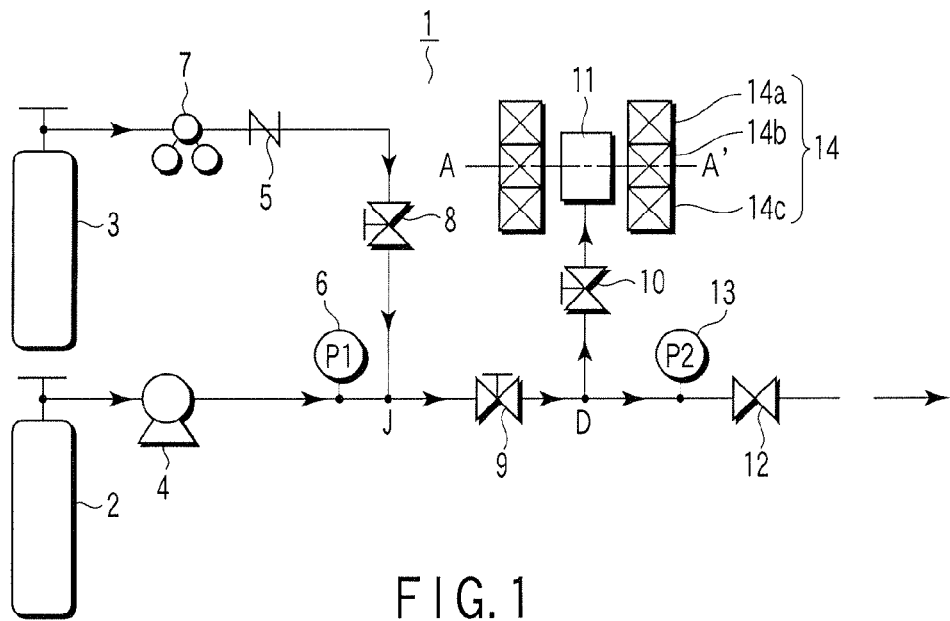
FIG. 1 is a schematic block diagram showing an apparatus for selectively forming an electric conductor according to a first embodiment.

As shown in FIG. 1, two cylinders, i.e., first and second cylinders 2 and 3 are provided at the most upstream portion of the apparatus 1 for selectively forming an electric conductor. Inside the first cylinder 2, although not shown, carbon dioxide ($CO_2$) serving as a material for a supercritical fluid is contained in a liquefied state. Carbon dioxide is obtained, in an atmosphere of about 31° C. and more, and about 7.4 MPa and more, as a supercritical fluid that is neither a liquid nor a gas, having natures of both a liquid phase (liquid) and a gas phase (gas). Specifically, carbon dioxide becomes in a state having dissolving capability equivalent to a liquid, a high diffusion property equivalent to a gas, a surface tension substantially equal to zero, and a high density in an atmosphere of about 31° C. and more, and about 7.4 MPa and more. An internal pressure of the first cylinder 2 is set at about 5 MPa to 6 MPa. The first cylinder 2 is connected to a liquid supply pump 4. A pressure of carbon dioxide sent out from the first cylinder 2 is increased to about 8 MPa by means of the liquid supply pump 4. The pressure of carbon dioxide having passed through the liquid supply pump 4 is measured by means of a first pressure gauge 6.

Inside the second cylinder 3, hydrogen ($H_2$) is contained as a substance for accelerating precipitation of a metal 10 from a metal compound 18 including a metal 20 which serves as a main component of an electric conductor 21 described later. Hydrogen has an action (entrainer effect) of enhancing a degree of saturation dissolving of the metal compound 18 with respect to a supercritical fluid. The metal included in the metal compound 18 excessively dissolved in the supercritical fluid is easily precipitated by such excessive dissolving. The second cylinder 3 is connected to a pressure regulator 7. A pressure of hydrogen sent out from the second cylinder 3 is reduced to about 0.3 MPa by means of the pressure regulator 7. Hydrogen having passed through the pressure regulator 7 passes through a check valve 5 and a first valve 8, and then, joins at a joint point J with the carbon dioxide having passed through the first pressure gauge 6.

The flows of carbon dioxide and hydrogen having passed through the joint point J are divided two ways at a divergence point D. One of these flows is supplied through a second valve 9 and a third valve 10 into a pressure resistance reactor container 11 in which a processing target 16 and the metal compound 18 are disposed, an electric conductor 21 being provided at the processing target 16 and the metal compound. In contrast, the other one of them is discharged, through a back pressure valve 12, to outside of the apparatus 1 for selectively forming an electrical conductor. The back pressure valve 12 functions in the same manner as the pressure regulator 7 and regulates a pressure of a whole line of the apparatus 1 for selectively forming an electric conductor so as to be maintained at a proper value. The pressure of the whole line of the apparatus 1 for selectively forming an electric conductor is measured by means of a second pressure gauge 13 provided in the middle of the divergence point D and the back pressure valve 12.

For example, while the pressure of the whole line is monitored by means of the second pressure gauge 13 so that the pressure of the whole line of the apparatus 1 for selectively forming an electric conductor is within the range of about ±10% and periodically rises and falls at predetermined intervals, the back pressure valve 12 is opened and closed at predetermined cycles. Then, a pressure of an internal atmosphere of the pressure-resistant reactor container 11 is also within the range of about ±10% and periodically rises and falls at predetermined intervals. In this manner, the density of the internal atmosphere of the pressure-resistant reactor container 11 is within the range of about ±10% and becomes periodically non-uniform at predetermined intervals. That is, a pulse-like fluctuation can be generated in the density of the internal atmosphere of the pressure-resistant reactor container 11. As a result, a pulse-like fluctuation can be generated in the density of carbon dioxide serving as a material for the supercritical fluid supplied into the pressure-resistant reactor container 11. If such a fluctuation occurs in the density of the supercritical fluid, there increases the degree of dissolving of a metal compound that serves as a solute dissolved in supercritical fluid serving as a solvent.

In addition, a mantle heater 14 for heating the inside of the pressure-resistant reactor container 11 is provided around the pressure-resistant reactor container 11. The mantle heater 14 is formed as a three-layered structure of an upper mantle heater 14a, a middle mantle heater 14b, and a lower mantle heater 14c in this order from the top along a vertical direction of the pressure resistance reactor container 11. In addition, the mantle heater 14 is disposed so that a center part in the vertical direction thereof is aligned with a center part in the vertical direction of the pressure resistance reactor container 11 indicated by the alternate dot and chain line A-A' in FIG. 1. In addition, the upper, middle, and low mantle heaters 14a, 14b, and 14c are actuated independently of each other, and the inside of the pressure-resistant reactor container 11 can be individually heated in the upper, middle, and lower parts thereof.

For example, among the upper, middle, and lower mantle heaters 14a, 14b, and 14c, if only the upper mantle heater 14a is periodically actuated at predetermined intervals, the inside of the pressure-resistant reactor container 11 is heated periodically eccentrically at predetermined intervals from its upper side. Then, at the inside of the pressure-resistant reactor container 11, a temperature of the upper part becomes periodically higher than that of the lower part at predetermined intervals, and temperature non-uniformity occurs inside the pressure-resistant reactor container 11. If the internal temperature of the pressure-resistant reactor container 11 becomes non-uniform, convection periodically occurs at predetermined intervals in the internal atmosphere of the pressure-resistant reactor container 11. In this manner, a difference in density periodically occurs at predetermined intervals between the upper and lower parts of the internal atmosphere of the pressure-resistant reactor container 11. In other words, a pulse-like density fluctuation occurs in the internal atmosphere of the pressure-resistant reactor container 11. As a result, like intermittently opening and closing the back pressure valve 12, a pulse-like fluctuation can be caused to occur in the density of carbon dioxide serving as a material for the supercritical fluid supplied into the pressure-resistant reactor container 11.

Such a phenomenon can be caused by individually and intermittently actuating the middle mantle heater 14b or the lower mantle heater 14c as well as the upper mantle heater 14a. Alternatively, among the upper, middle, and lower mantle heaters 14a, 14b, and 14c, two of them are actuated in combination, whereby a similar phenomenon can be caused. That is, by individually and intermittently actuating the mantle heaters 14a, 14b, and 14c as well, like intermittently opening and closing the back pressure valve 12, the internal atmosphere of the pressure-resistant reactor container 11 is made partially non-uniform periodically at predetermined intervals, whereby a pulse-like density fluctuation can be caused to occur in the internal atmosphere of the pressure-resistant reactor container 11. In contrast, if the upper, middle, and lower mantle heaters 14a, 14b, and 14c are actuated simultaneously, the internal atmosphere of the pressure-resistant reactor container 11 is heated entirely uniformly without occurrence of heating non-uniformity. In other words, with respect to the internal atmosphere of the pressure-resistant reactor container 11, a pulse-like density fluctuation hardly occurs in the density thereof.

Figure 2:
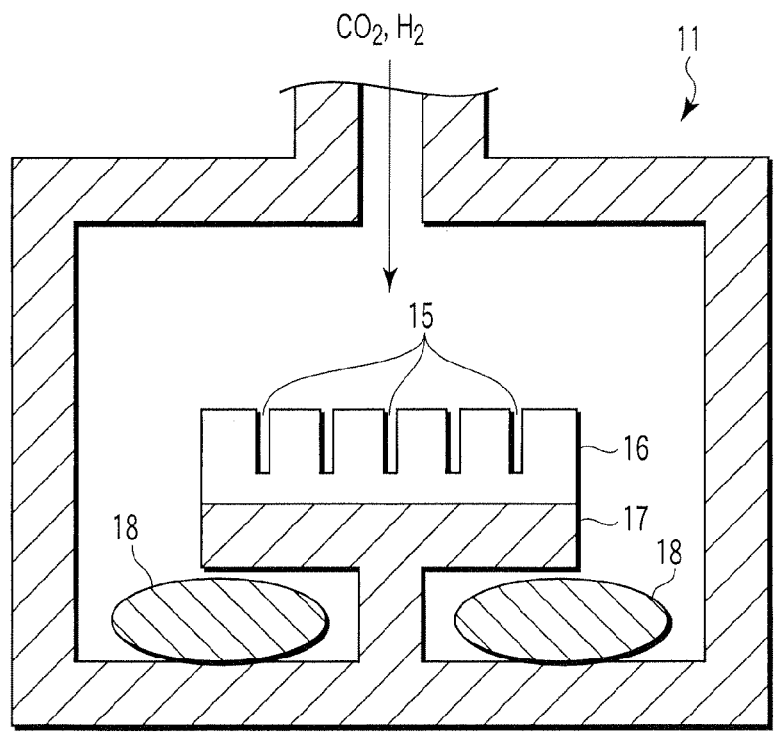
FIG. 2 is a cross section briefly showing an inside of a reactor container includes in the apparatus for selectively forming an electric conductor shown in FIG. 1.

As shown in FIG. 2, a processing target 16, having formed thereat a plurality of recesses 15 with high fineness and a high aspect ratio for providing an electric conductor 21, is contained inside the pressure-resistant reactor container 11. The processing target 16 is placed in posture in which the recesses 15 are oriented upward on a base 17 that serves as a processing target support base provided inside the pressure-resistant reactor container 11. In addition, the metal compound 18 including the metal 20 that is a main component of the electric conductor 21 is also contained inside the pressure-resistant reactor container 11. Although not shown, in the pressure-resistant reactor container 11, a window for observing the inside thereof is also provided.

Referring now to FIGS. 2 to 5, a description will be given with respect to a method for selectively forming an electric conductor according to the present embodiment. The method for selectively forming an electric conductor according to the present embodiment is specifically directed to a method for selectively providing the electric conductor 21 inside a plurality of recesses 15 with high fineness and a high aspect ratio formed at a top layer portion of the processing target 16 by using the apparatus 1 for selectively formed an electric conductor described previously.

First, as shown in FIG. 2, a silicon substrate 16 and the metal compound 18 are disposed inside the pressure-resistant reactor container 11. In the present embodiment, the silicon substrate 16 made of silicon (Si) is used as the processing target. In addition, in the present embodiment, ruthenium (Ru) serving as one kind of metal that belongs to a platinum group is provided in each of the recess 15. Therefore, a material containing ruthenium is used as the metal compound 18. Here, as the metal compound 18, cyclopentadienyl ruthenium ($Ru(C_5H_5)_2$, $RuCp_2$) of a solid phase (solid) serving as one kind of organic metal complex (precursor) is disposed inside the pressure-resistant reactor container 11 together with the silicon substrate 16. A melting point of this cyclopentadienyl ruthenium is about 200° C.

Figure 3A:
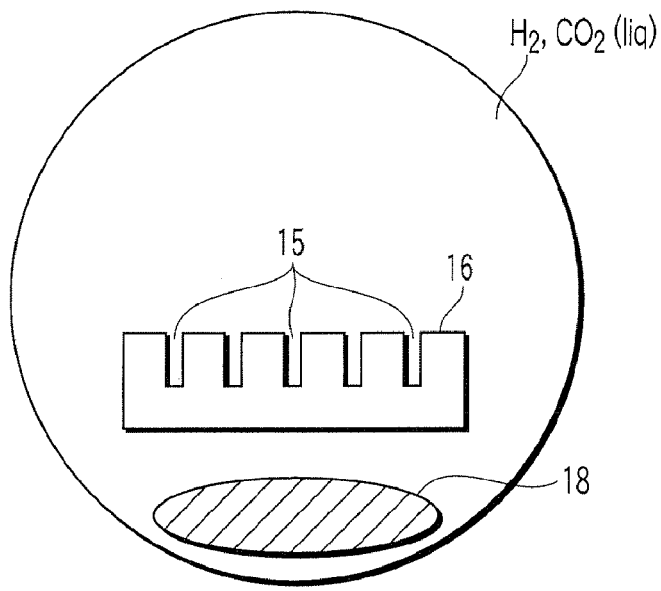
FIGS. 3A and 3B are views schematically showing a method for selectively forming an electric conductor according to the first embodiment.

Next, as shown in FIG. 3A, the liquid supply pump 4, the check valve 5, the pressure regulator 7, the first valve 8, the second valve 9, the third valve 10, and the back pressure valve 12, of the apparatus 1 for selectively forming an electric conductor, are actuated, and then, hydrogen and liquid carbon dioxide are supplied, respectively, by a proper amount, to the inside of the pressure-resistant reactor container 11 having contained therein the silicon substrate 16 and the solid cyclopentadienyl ruthenium 18. In this state, the cyclopentadienyl ruthenium 18 exists as a solid.

Figure 3B:
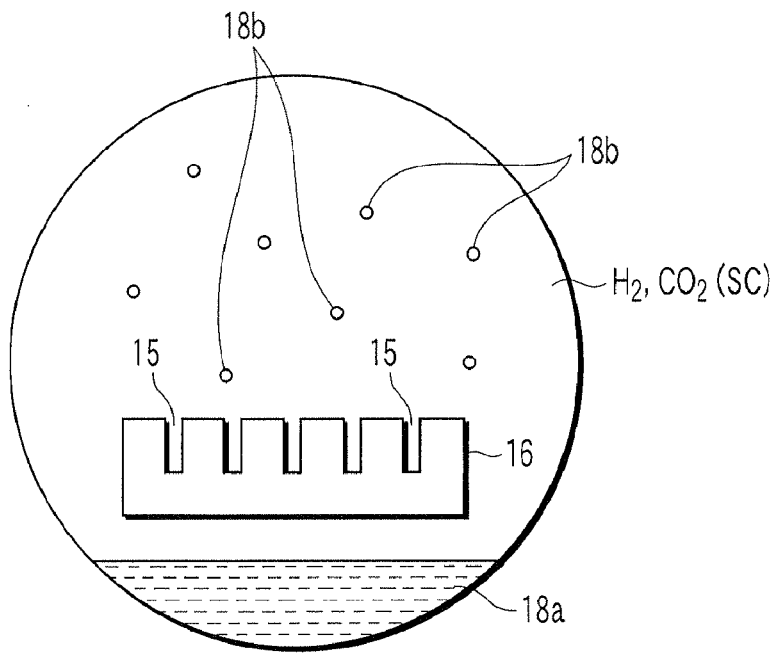

Next, as shown in FIG. 3B, the mantle heater 14 is actuated, and the pressure-resistant reactor container 11 is heated from the outside thereof. Concurrently, a pump is actuated, although not shown, and then, the inside of the pressure-resistant reactor container 11 is pressurized. In this manner, the internal atmosphere of the pressure-resistant reactor container 11 is caused to reach about 31° C. and the pressure (whole pressure) of the internal atmosphere of the pressure-resistant reactor container 11 is caused to reach about 7.4 MPa. Then, at this stage, carbon dioxide in the pressure-resistant reactor container 11 is changed in phase from a liquid to a supercritical fluid. Then, carbon dioxide serving as a supercritical fluid, as described previously, has a dissolving capability equivalent to a liquid, a high diffusion property equivalent to a gas, surface tension substantially equal to zero, and high density.

Subsequently, the temperature and pressure of the internal atmosphere of the pressure-resistant reactor container 11 are further increased; the temperature of the internal atmosphere of the pressure-resistant reactor container 11 is caused to reach about 200° C., and then, the pressure (whole pressure) of the internal atmosphere of the pressure-resistant reactor container 11 is caused to reach about 8 MPa. Then, at this stage, the cyclopentadienyl ruthenium 18 serving as a solid organic metal complex is fused and changed in phase from a solid phase (solid) to a liquid phase (liquid). Then, in cyclopentadienyl ruthenium 18a serving as a liquid, at least part thereof is formed in a molecular shape, and is dissolved and mixed in carbon dioxide that serves as a supercritical fluid having dissolving capability equivalent to a liquid. In other words, carbon dioxide serving as a supercritical fluid behaves as a solvent and cyclopentadienyl ruthenium 18b formed in a molecular shape behaves as a solute. In the present embodiment, the cyclopentadienyl ruthenium 18a is dissolved up to an excessively saturated state relative to carbon dioxide that serves as a supercritical fluid so that ruthenium is easily precipitated from the liquid cyclopentadienyl ruthenium 18a.

In order to dissolve the molecular cyclopentadienyl ruthenium 18b up to an excessively saturated state relative to carbon dioxide serving as a supercritical fluid, as described previously, hydrogen may be added to an atmosphere containing carbon dioxide serving as a supercritical fluid. According to this method, the degree of dissolving of the cyclopentadienyl ruthenium 18a into carbon dioxide serving as a supercritical fluid can be increased due to an entrainer effect of hydrogen without introducing excessive solid cyclopentadienyl ruthenium 18 into the pressure-resistant reactor container 11.

Carbon dioxide serving as a supercritical fluid is a very stable substance in view of chemical reaction. Therefore, in a state in which the molecular cyclopentadienyl ruthenium 18b is excessively saturated relative to carbon dioxide serving as a supercritical fluid, the molecular cyclopentadienyl ruthenium 18b and carbon dioxide coexist in the internal atmosphere of the pressure-resistant reactor container 11 in a two-phase separated state in which their respective phases are separated from each other. In other words, there is almost no anxiety that the molecular cyclopentadienyl ruthenium 18b and carbon dioxide that serves as a supercritical fluid cause chemical reaction with each other and are deformed. In addition, carbon dioxide serving as a supercritical fluid has high diffusion property equivalent to a gas, and thus, the molecular cyclopentadienyl ruthenium 18b is dissolved substantially uniformly without eccentricity in carbon dioxide serving as a supercritical fluid.

Figure 4A:
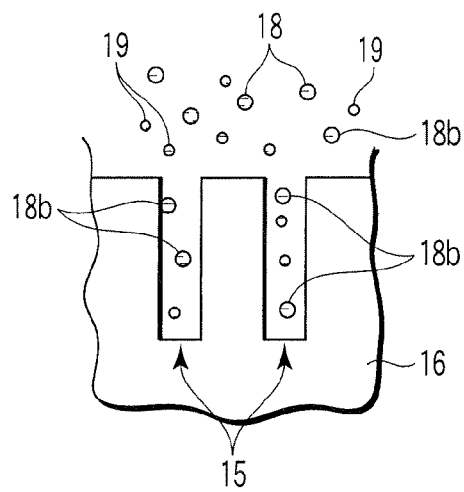
FIGS. 4A, 4B, 4C, and 4D are sectional views each showing a method for selectively forming an electric conductor according to the first embodiment.

As shown in FIG. 4A, when the silicon substrate 16 serving as an abnormal object exists in an atmosphere in which the molecular cyclopentadienyl ruthenium 18b and carbon dioxide serving as a supercritical fluid or hydrogen 19 coexist, the molecular cyclopentadienyl ruthenium 18b is attracted toward the silicon substrate 16 by means of affinity. Then, the molecular cyclopentadienyl ruthenium 18b is adsorbed or deposited in contact with a surface of the silicon substrate 16. Hence, the molecular cyclopentadienyl ruthenium 18b is dissolved in carbon dioxide serving as a supercritical fluid of which a surface tension is substantially equal to zero, whereby its fluidity is in a very rich highly dense state. Thus, the molecular cyclopentadienyl ruthenium 18b adsorbed or deposited onto the surface of the silicon substrate 16, as shown in FIG. 4A, smoothly flows along the surface of the silicon substrate 16, and then, is selectively introduced in a self-aligned manner into each of the recess 15 made to be lower than the surface of the silicon substrate 16. In other words, the molecular cyclopentadienyl ruthenium 18b adsorbed or deposited onto the surface of the silicon substrate 16 is preferentially introduced into each of the recess 15.

Figure 4B:
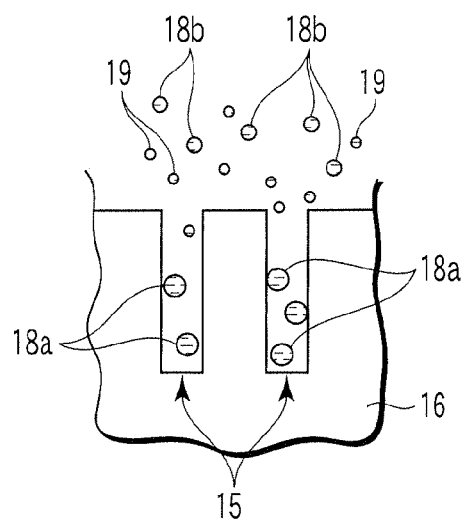

As shown in FIG. 4B, when the molecular cyclopentadienyl ruthenium 18b goes into (coats) each of the recess 15, a fluctuation occurs in the density of the internal atmosphere of the pressure-resistant reactor container 11 in the vicinity of the surface of the silicon substrate 16. As a result, a fluctuation occurs in the density of carbon dioxide serving as a supercritical fluid. Specifically, the internal atmosphere of the pressure-resistant reactor container 11 and the density of carbon dioxide serving as a supercritical fluid become high at the upper part and become low at the lower part, in the pressure-resistant reactor container 11. Then, a plurality of cyclopentadienyl ruthenium molecules 18b dissolved in an excessively saturated state in carbon dioxide serving as a supercritical fluid are attracted to each other, and coagulate due to a capillary phenomenon. As a result, liquid cyclopentadienyl ruthenium 18a is precipitated in each of the recess 15.

Figure 4C:
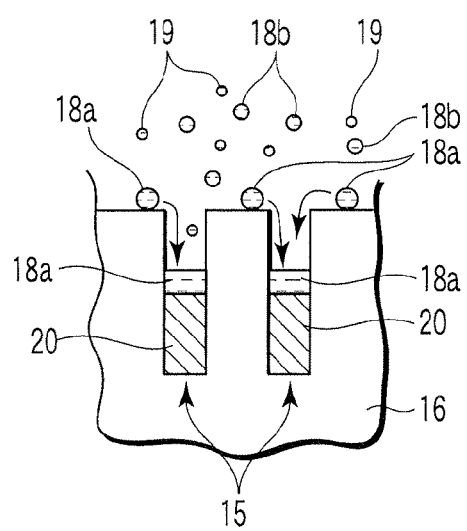

As shown in FIG. 4C, the liquid cyclopentadienyl ruthenium 18a precipitated in each of the recess 15 is sequentially filled in each of the recess 15 from a bottom part to an upper part thereof as is the case with a general liquid. As described previously, carbon dioxide serving as a supercritical fluid has high density so that the molecular cyclopentadienyl ruthenium 18b dissolved in carbon dioxide serving as a supercritical fluid can enter the inside of each of the recess 15 with almost no gaps. Therefore, the inside of such each recess 15 is sequentially filled with the liquid cyclopentadienyl ruthenium 18a from the bottom part to the upper part thereof in a compact manner.

Then, the liquid cyclopentadienyl ruthenium 18a precipitated in each of the recess 15 reacts with hydrogen 19, and then, is reduced. In this manner, ruthenium 20 serving as a main component of the electric conductor 21 is decomposed from the liquid cyclopentadienyl ruthenium 18a and precipitated in each of the recess 15. Therefore, in the present embodiment, the inside of such each recess 15 is filled with the cyclopentadienyl ruthenium 18a sequentially compactly from the bottom part to the upper part thereof, and concurrently, the ruthenium 20 is precipitated sequentially compactly from the bottom part to the upper part thereof inside each of the recess 15. The precipitation reaction of the ruthenium 20 from this cyclopentadienyl ruthenium 18a is expressed in accordance with the chemical formula (1) below.

$$Ru^{II}Cp_2 + H_2 \rightarrow Ru^O + 2HCp \quad (1)$$

In ruthenium precipitation reaction expressed by the chemical formula (1) above, the hydrogen 19 functions as a reducing agent relative to the cyclopentadienyl ruthenium 18a. Then, the ruthenium 20 precipitated in each of the recess 15 is sequentially deposited from the bottom part to the upper part thereof in each of the recess 15 due to capillary coagulation. The ruthenium 20 is precipitated in each of the recess 15 until the inside of such each recess 15 is filled with the ruthenium 20 with almost no gap. In addition, if the hydrogen ($H_2$) 19 is consumed in response to chemical reaction expressed by the chemical formula (1) above, the degree of dissolving of the cyclopentadienyl ruthenium 18b contained in carbon dioxide established in a supercritical fluid state is lowered, and thus, coagulation of the ruthenium 20 accelerates more and more.

Figure 4D:
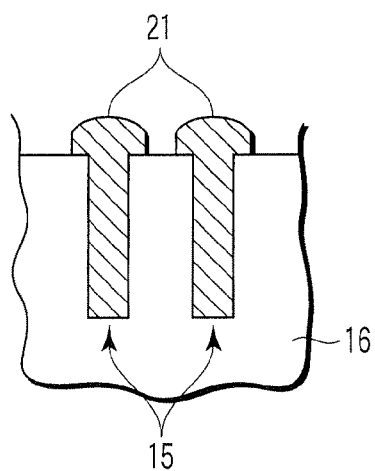

Then, as shown in FIG. 4D, after the ruthenium 20 has been deposited until the ruthenium 20 overflows from the inside of each of the recess 15 onto the surface of the silicon substrate 16, the liquid supply pump 4, the check valve 5, the pressure regulator 7, the first valve 8, the second valve 9, the third valve 10, the mantle heater 14 and the like, of the apparatus 1 for selectively forming an electric conductor, are deactivated. In this manner, the heating and pressurization of the internal atmosphere of the pressure-resistant reactor container 11 are stopped, and then, the temperature and pressure of the internal atmosphere of the pressure-resistant reactor container 11 are lowered. Concurrently, the supply or the like of carbon dioxide or the hydrogen 19 into the pressure resistance reactor container 11 is stopped. Then, a substance such as carbon dioxide or the hydrogen 19 is discharged from the inside of the pressure-resistant reactor container 11.

Figures 5, 6:
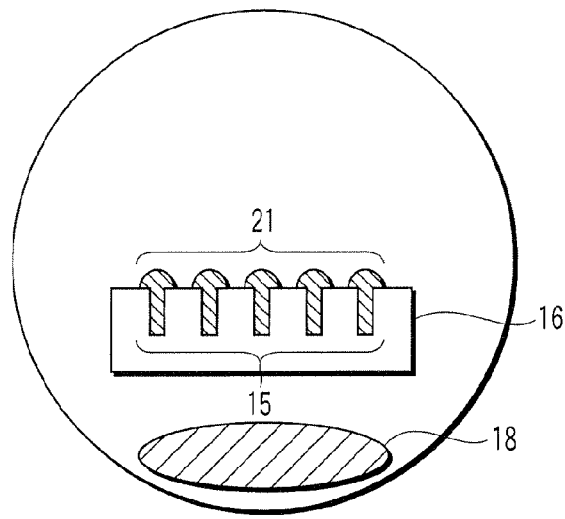
FIG. 5 is a view schematically showing a method for selectively forming an electric conductor according to the first embodiment.
FIG. 6 is a view tabulating processing conditions for a method for selectively forming an electric conductor according to the first embodiment.

As a result, as shown in FIG. 5, a thin film 21 made of elemental ruthenium serving as an electric conductor is selectively provided inside and in the vicinity of an opening of a plurality of recess 15 with high fineness and a high aspect ratio formed at a top layer part of the silicon substrate 16. The inside of such each recess 15 is filled with the ruthenium thin film (Ru thin film) 21 with almost no gaps and without forming voids.

Figure 7:
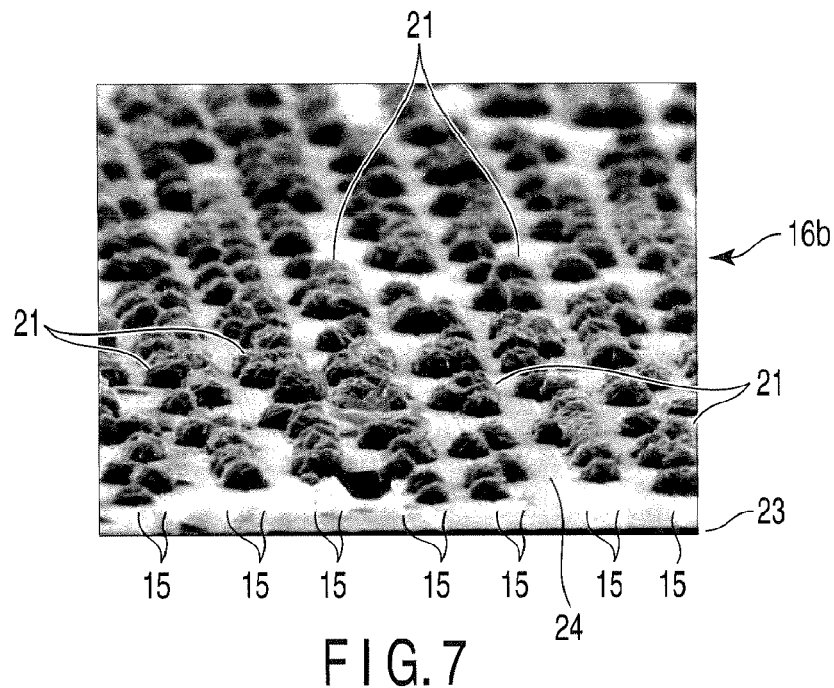
FIG. 7 is a perspective view showing, by using a SEM photograph, the vicinity of an electric conductor formed under the processing conditions shown in FIG. 6.
Figure 8:
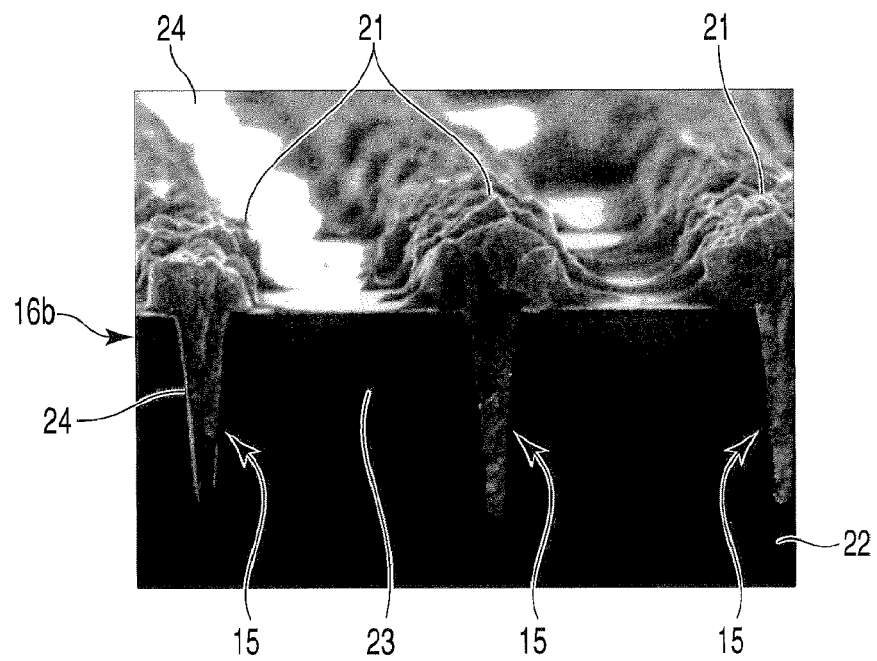
FIG. 8 is a sectional view showing, by using a SEM photograph, the vicinity of an electric conductor formed under the processing conditions shown in FIG. 6.

Referring now to FIGS. 6 to 8, a description will be given with respect to experiments that the inventors carried out by using a method for selectively forming an electric conductor according to the present embodiment described above.

The inventors, as shown in FIG. 6, attempted the method for selectively forming an electric conductor described previously under the settings in which some of the processing conditions have been changed. Specifically, an amount of the cyclopentadienyl ruthenium 18 serving as a material for the ruthenium thin film 21 was set to either about 25 mg/cc or about 5 mg/cc. In addition, an additive pressure of the hydrogen 19 added to carbon dioxide serving as a supercritical fluid was set to either about 1 MPa or about 0.2 MPa. A pressure (whole pressure) of the atmosphere in the pressure-resistant reactor container 11 in which the silicon substrate 16 or the like is to be contained was set to about 12 MPa. In addition, a processing temperature at the time of depositing the ruthenium thin film 21 was set to about 250° C. A processing time for executing the method for selectively forming an electric conductor was set to about 15 minutes.

In addition, although not described in FIG. 6, the inventors employed four types of silicon substrates, first to fourth silicon substrates that are differently configured from one another, as silicon substrates 16. Specifically, the first silicon substrate has a configuration in which a silicon dioxide film ($SiO_2$ film) serving as an insulation film is provided on a silicon layer serving as a substrate main body. In addition, the second silicon substrate has a configuration in which a surface of the silicon dioxide film of the first silicon substrate is coated with a thin film of gold (Au) serving as another electric conductor independent of ruthenium. In addition, the third silicon substrate has a configuration in which a surface of the silicon dioxide film of the first silicon substrate is coated with a thin film of titanium nitride (TiN) serving as another electric conductor independent of ruthenium. Further, the fourth silicon substrate has a configuration in which a surface of the titanium nitride thin film of the third silicon substrate is further coated with a gold thin film.

The inventors attempted to form a plurality of recesses (trenches, grooves, holes, and pores) with high fineness and a high aspect ratio at a top layer portion of each of these first to fourth silicon substrates, and then, form an electric conductor made of ruthenium inside of each of these recess. The first to fourth silicon substrates each are disposed in a state in which each of them was sealed with the cyclopentadienyl ruthenium 18 and the hydrogen 19 in carbon dioxide serving as the supercritical fluid in a pressure-resistant reactor conductor 11. Such a processing method is referred to as a batch technique. Here, referring to FIGS. 7 and 8, a description will be given with respect to a result of a experiment in which the thin film 21 made of ruthenium was formed in each of the recess 15 formed on a second silicon substrate 16b among the experiments using the batch technique. Using a SEM photograph, FIGS. 7 and 8 each show a result obtained when the batch technique described previously was carried out by setting an amount of the cyclopentadienyl ruthenium 18 at about 25 mg/cc and setting an additive pressure of the hydrogen 19 at about 1.0 MPa.

As shown in FIG. 7, it was verified that the ruthenium thin film 21 was selectively formed along each of the recess 15 on a gold thin film 24 that configures a surface of the second silicon substrate 16b. In addition, as shown in FIG. 8, each of the recess 15 is formed in a silicon dioxide film 23 serving as an insulation film provided on a silicon layer 22 that serves as a substrate main body of the second silicon substrate 16b. Then, like a surface of the second silicon substrate 16b, an inside surface of each of the recess 15 is also fully coated with the gold thin film 24. Dimensions of each of the recess 15 are such that a width of a bottom part is formed to be about 130 nm, a width of an opening is formed to be about 200 nm, and a depth is formed to be about 2 μm. In other words, an aspect ratio of each of the recess 15 is about 10 to 15. The batch technique described previously was carried out with respect to the thus configured second silicon substrate 16b. As a result, as shown in FIG. 8, it was verified that the inside of each of the recess 15 was filled with almost no gap from a bottom part to an upper part thereof.

As has been described above, in the first embodiment, the liquefied cyclopentadienyl ruthenium 18a serving as a material for the ruthenium thin film 21 is dissolved in carbon dioxide serving as a supercritical fluid having dissolving capability equivalent to a liquid, high diffusion property equivalent to a gas, surface tension substantially equal to zero, high density, and chemical stability. In this manner, the cyclopentadienyl ruthenium 18a can be filled in the inside of the recess 15 with almost no gap even if a plurality of recesses 15 are shaped to have a high aspect ratio of about 10 to 15. In addition, the cyclopentadienyl ruthenium 18a selectively flows in a self-aligned manner into each of the recess 15 made to be lower than a surface of the silicon substrate 16 regardless of a material (chemical properties) for the inside surface of each of the recess 15 that serves as an undercoat of the ruthenium thin film 21. That is, a metal serving as a main component of an electric conductor can be preferentially filled in each of the recess 15 by utilizing an undercoat structure or physical properties regardless of a material for such an undercoat. A method for forming an electric conductor utilizing such a principle (method for depositing an electric conductor thin film) is also referred to as a shape sensitive deposition technique.

The inside of each of the recess 15 is sequentially filled with the cyclopentadienyl ruthenium 18a with almost no gap from a bottom part to an upper part (opening) thereof. In addition, from the cyclopentadienyl ruthenium 18a preferentially filled in each of the recess 15 with almost no gap, the ruthenium 20 precipitated from the cyclopentadienyl ruthenium 18a is sequentially filled in from the bottom part to the upper part of each of the recess 15. As a result, each of the recess 15 is easily embedded (filled up) with the ruthenium thin film 21 efficiently, selectively, and with almost no gap regardless of a material for the undercoat even if such each recess 15 has high fineness and a high aspect ratio. In this manner, a film forming method for sequentially embedding or filling up each of the recess 15 from the bottom part to the upper part thereof (deposition method) can be referred to as a bottom-up film forming technique (bottom-up deposition technique).

In addition, in a method for selectively forming an electric conductor according to the present embodiment using a combination of a supercritical fluid and a shape sensitive deposition technique, there is a low risk that impurities are mixed in comparison with a CVD technique. In addition, the method for selectively forming an electric conductor according to the present embodiment is a process that is much highly dense in comparison with a PVD technique or a CVD technique. Thus, each of the recess 15 that has a high aspect ratio and is formed in a complicated shape are efficiently and easily embedded (filled up), and complicated-shaped parts can be produced at a higher speed. That is, the method for selectively forming an electric conductor of the present embodiment has high throughput in comparison with the PVD technique or the CVD technique. For example, in the PVD technique or the CVD technique, a film of an electric conductor is formed not only at the recess but also fully on a surface of a layer in which the recesses are formed. In contrast, the method for selectively forming an electric conductor according to the present embodiment is capable of selectively forming a film of an electric conductor only inside the recess 15 or in the vicinity thereof. Thus, this method hardly wastes materials in comparison with the PVD technique or the CVD technique and is capable of eliminating a process such as a whole-wafer process. In other words, the method for selectively forming an electric conductor according to the present embodiment is high in productivity in comparison with the PVD technique or the CVD technique.

In addition, in an organic metal CVD technique utilizing a liquid material, the liquid material is chemically unstable and is small in process margin. In contrast, in the method for selectively forming an electric conductor according to the present embodiment, a material is chemically stable and is large in process margin. In addition, the method for selectively forming an electric conductor according to the present embodiment is capable of forming the ruthenium thin film 21 at a low temperature in comparison with the PVD technique or the CVD technique, and thus, is wide in process margin of a deposition temperature. In other words, the method for selectively forming an electric conductor according to the present embodiment can alleviate the process temperature dependency. In addition, the method for selectively forming an electric conductor according to the present embodiment has high recovery of expensive, rare materials in comparison with the PVD technique or the CVD technique, and is easy in reuse thereof. As described above, the method for selectively forming an electric conductor according to the present embodiment saves materials and saves energy efficiently in comparison with the PVD technique or the CVD technique. Thus, this method has good process efficiency and is environmentally friendly. Further, according to the method for selectively forming an electric conductor of the present embodiment, some steps are omitted in comparison with the PVD technique or the CVD technique or a use amount of materials can be restrained or reduced, thus making it possible to restrain or reduce manufacturing costs easily in comparison with the PVD technique or the CVD technique.

Second Embodiment

Now, a second embodiment according to the present invention will be described with reference to FIGS. 9A to 13. Like constituent elements in the first embodiment described previously are designated by like reference numerals. A detailed description of these constituent elements is omitted here. The present embodiment describes a result obtained by carrying out the experiments carried out by the inventors in the first embodiment described previously while a processing conduction is slightly changed.

As shown in FIG. 12, in the present embodiment, unlike the experiments described in the first embodiment, an amount of cyclopentadienyl ruthenium ($Ru(Cp)_2$) 18 serving as a material for a ruthenium thin film 21 was set to either about 50 mg/cc or about 10 mg/cc. Other processing conditions are similar to those for the experiments described in the first embodiment. Under such a processing condition, the inventors attempted to form the ruthenium thin film 21 using the method for selectively forming an electric conductor described in the first embodiment with respect to each of the first to fourth silicon substrates. Then, the inventors analyzed an experiment result regarding two matters, i.e., a deposition situation (embedding property, filling up property) and shape sensitivity (selectivity) of the ruthenium thin film 21 with respect to the first to fourth silicon substrates.

As shown in FIGS. 9A, 9B, 9C, and 9D, a first silicon substrate 16a has a configuration in which a silicon dioxide film ($SiO_2$ film) 23 serving as an insulation film is provided on a silicon layer 22 serving as a substrate main body. In addition, a second silicon substrate 16b has a configuration in which a surface of the silicon dioxide film 23 of the first silicon substrate 16a is coated with a gold (Au) thin film 24. In addition, a third silicon substrate 16c has a configuration in which a surface of the silicon dioxide film 23 of the first silicon substrate 16a is coated with a thin film 31 made of titanium nitride (TiN). Further, a fourth silicon substrate 16d has a configuration in which a surface of the titanium nitride thin film 31 of the third silicon substrate 16c is coated with the gold thin film 24.

Figure 9A:
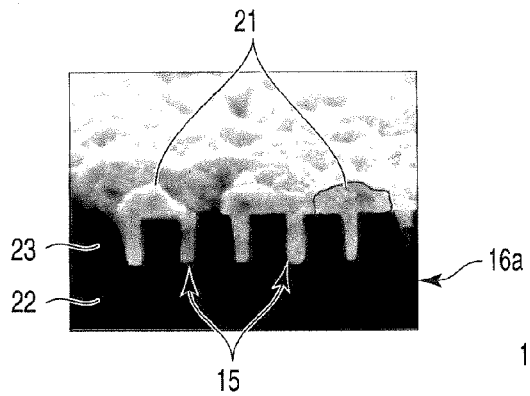
FIGS. 9A, 9B, 9C, and 9D are sectional views and perspective views showing, by using a SEM photograph, the vicinity of an electric conductor formed in accordance with a method for selectively forming an electric conductor according to a second embodiment.

First, FIG. 9A shows a result obtained by carrying out experiments in which an amount of the cyclopentadienyl ruthenium 18 was set at about 50 mg/cc and an additive pressure of hydrogen 19 was set at about 1 MPa; and the ruthenium thin film 21 was formed, in accordance with the method for selectively forming an electric conductor described in the first embodiment, on the first silicon substrate 16a. As is evident from a photograph shown in FIG. 9A, the ruthenium thin film 21 is deposited while the recesses 15 each are embedded (filled up) with almost no gap, and the deposition situation of the ruthenium thin film 21 is good. However, the ruthenium thin film 21 is fully deposited on a surface of the first silicon substrate 16a as well as each of the recesses 15 and the vicinity of an opening thereof. Therefore, the shape sensitivity of the ruthenium thin film 21 cannot be expected so much.

Figure 9B:
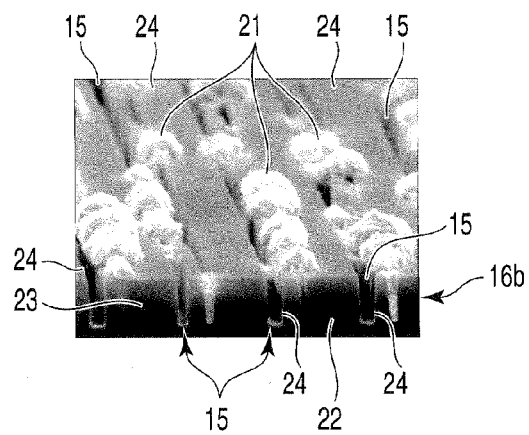

Next, FIG. 9B shows a result obtained by carrying out experiments in which an amount of the cyclopentadienyl ruthenium 18 was set at about 50 mg/cc and an additive pressure of the hydrogen 19 was set at about 1 MPa; and the ruthenium thin film 21 was formed, in accordance with the method for selectively forming an electric conductor described in the first embodiment, on the second silicon substrate 16b. As is evident from a photograph shown in FIG. 9B, the ruthenium thin film 21 is deposited so as to embed (fill up) each of the recess 15, and the deposition situation of the ruthenium thin film 21 is good. In addition, the ruthenium thin film 21 is selectively deposited at the inside and in the vicinity of an opening thereof along each of the recess 15. Therefore, the shape sensitivity of the ruthenium thin film 21 is also good.

Figure 9C:
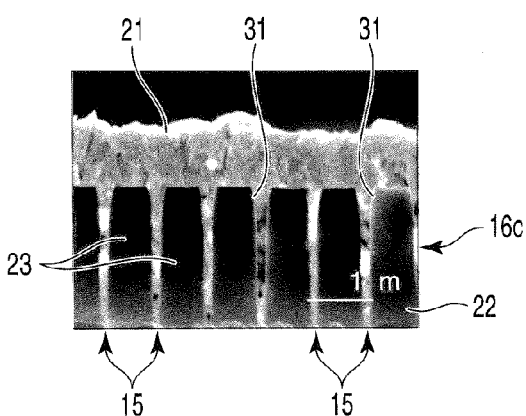

Next, FIG. 9C shows a result obtained by carrying out experiments in which an amount of the cyclopentadienyl ruthenium 18 was set at about 50 mg/cc and an additive pressure of the hydrogen 19 was set at about 1 MPa; and the ruthenium thin film 21 was formed, in accordance with the method for selectively forming an electric conductor described in the first embodiment, on the third silicon substrate 16c. As is evident from a photograph shown in FIG. 9C, the ruthenium thin film 21 is deposited while the recesses 15 each are embedded (filled up) with almost no gap, and the deposition situation of the ruthenium thin film 21 is good. However, as is the case with the first silicon substrate 16a, the ruthenium thin film 21 is fully deposited in a thick shape on a surface of the third silicon substrate 16c as well as each of the recess 15 and the vicinity of an opening thereof. Therefore, the shape sensitivity of the ruthenium thin film 21 cannot be expected so much.

Figure 9D:
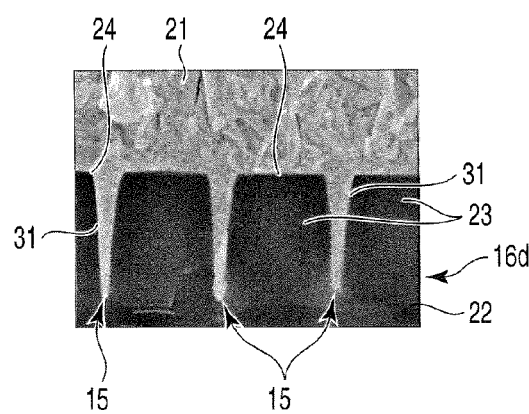

Next, FIG. 9D shows a result obtained by carrying out experiments in which an amount of the cyclopentadienyl ruthenium 18 was set at about 50 mg/cc and an additive pressure of the hydrogen 19 was set at about 1 MPa; and the ruthenium thin film 21 was formed, in accordance with the method for selectively forming an electric conductor described in the first embodiment, on the fourth silicon substrate 16d. As is evident from a photograph shown in FIG. 9D, the ruthenium thin film 21 is deposited while the recesses 15 each are embedded (filled up) with almost no gap, and the deposition situation of the ruthenium thin film 21 is good. However, as is the case with each of the first and third silicon substrates 16a and 16c, the ruthenium thin film 21 is fully deposited in a thick shape on a surface of the fourth silicon substrate 16d as well as each of the recess 15 and the vicinity of an opening thereof. Therefore, the shape sensitivity of the ruthenium thin film 21 cannot be expected so much.

Next, FIG. 10A shows a result obtained by carrying out experiments in which an amount of the cyclopentadienyl ruthenium 18 was set at about 10 mg/cc and an additive pressure of the hydrogen 19 was set at about 1 MPa; and the ruthenium thin film 21 was formed, in accordance with the method for selectively forming an electric conductor described in the first embodiment, on the first silicon substrate 16a. As is evident from a photograph shown in FIG. 10A, the ruthenium thin film 21 is deposited while the recess 15 each are embedded (filled up) with almost no gap, and the deposition situation of the ruthenium thin film 21 is good. In addition, the ruthenium thin film 21 is selectively deposited at the inside and in the vicinity of an opening thereof along each of the recess 15. Therefore, the shape sensitivity of the ruthenium thin film 21 is also good.

Next, FIG. 10B shows a result obtained by carrying out experiments in which an amount of the cyclopentadienyl ruthenium 18 was set at about 10 mg/cc and an additive pressure of the hydrogen 19 was set at about 1 MPa; and the ruthenium thin film 21 was formed, in accordance with the method for selectively forming an electric conductor described in the first embodiment, on the second silicon substrate 16b. As is evident from a photograph shown in FIG. 10B, the ruthenium thin film 21 eccentrically embeds (fills up) each of the recess 15, and the deposition situation cannot be expected so much. In addition, the ruthenium thin film 21 is deposited so as to rise in a mountain shape on a surface of the second silicon substrate 16b as well as each of the recess 15 and the vicinity of an opening thereof. Therefore, the shape sensitivity of the ruthenium thin film 21 is poor.

Next, FIG. 10C shows a result obtained by carrying out experiments in which an amount of the cyclopentadienyl ruthenium 18 was set at about 10 mg/cc and an additive pressure of the hydrogen 19 was set at about 1 MPa; and the ruthenium thin film 21 was formed, in accordance with the method for selectively forming an electric conductor described in the first embodiment, on the third silicon substrate 16c. As is evident from a photograph shown in FIG. 10, the ruthenium thin film 21 hardly embeds (fills up) each of the recess 15, and the deposition situation is poor. In addition, the ruthenium thin film 21 is hardly deposited anywhere on a surface of the third silicon substrate 16c as well as each of the recess 15 and the vicinity of an opening thereof. Therefore, the shape sensitivity of the ruthenium thin film 21 is poor.

Next, FIG. 10D shows a result obtained by carrying out experiments in which an amount of the cyclopentadienyl ruthenium 18 was set at about 10 mg/cc and an additive pressure of the hydrogen 19 was set at about 1 MPa; and the ruthenium thin film 21 was formed, in accordance with the method for selectively forming an electric conductor described in the first embodiment, on the fourth silicon substrate 16d. As is evident from a photograph shown in FIG.

10D, the ruthenium thin film 21 is deposited while the recess 15 each are partially embedded (filled up) with almost no gap, and the deposition situation of the ruthenium thin film 21 is good. In addition, the ruthenium thin film 21 is selectively deposited at the inside and in the vicinity of an opening thereof along each of the recess 15. Therefore, the shape sensitivity of the ruthenium thin film 21 is also good.

Figure 11A:
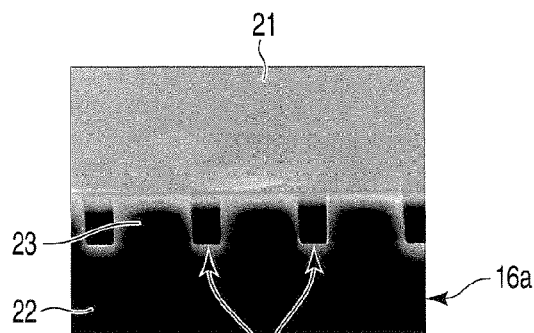
FIGS. 11A, 11B, 11C, and 11D are sectional views and plan views showing, by using a SEM photograph, the vicinity of an electric conductor formed in accordance with the method for selectively forming an electric conductor according to the second embodiment.

Next, FIG. 11A shows a result obtained by carrying out experiments in which an amount of the cyclopentadienyl ruthenium 18 was set at about 10 mg/cc and an additive pressure of the hydrogen 19 was set at about 0.2 MPa; and the ruthenium thin film 21 was formed, in accordance with the method for selectively forming an electric conductor described in the first embodiment, on the first silicon substrate 16a. As is evident from a photograph shown in FIG. 11A, the ruthenium thin film 21 hardly embeds (fills up) each of the recess 15, and the deposition situation of the ruthenium thin film 21 is poor. Concurrently, it is impossible to determine the shape sensitivity of the ruthenium thin film 21.

Figure 11B:
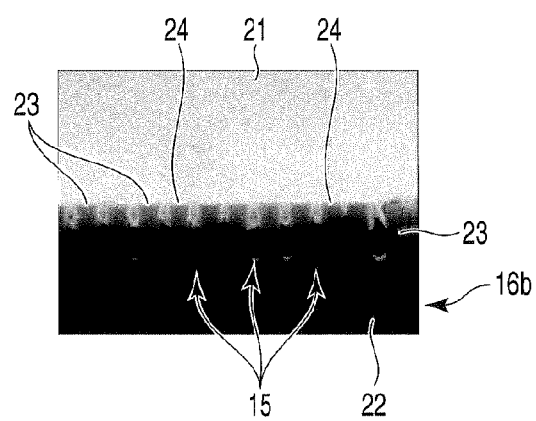

Next, FIG. 11B shows a result obtained by carrying out experiments in which an amount of the cyclopentadienyl ruthenium 18 was set at about 10 mg/cc and an additive pressure of the hydrogen 19 was set at about 0.2 MPa; and the ruthenium thin film 21 was formed, in accordance with the method for selectively forming an electric conductor described in the first embodiment, on the second silicon substrate 16b. As is evident from a photograph shown in FIG. 11B, the ruthenium thin film 21 is deposited while the recesses 15 each are partially embedded (filled up), and the deposition situation of the ruthenium thin film 21 is good. However, the ruthenium thin film 21 is fully deposited in a thick shape on a surface of the second silicon substrate 16b as well as each of the recess 15 and the vicinity of an opening thereof. Therefore, the shape sensitivity of the ruthenium thin film 21 is poor.

Figure 11C:
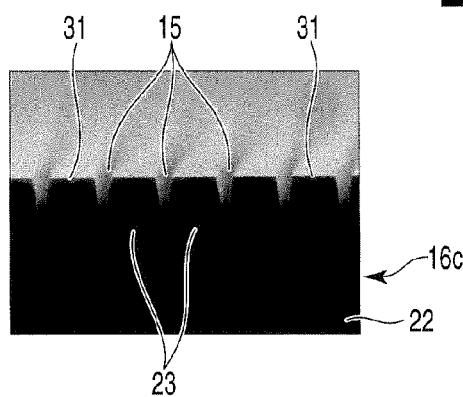

Next, FIG. 11C shows a result obtained by carrying out experiments in which an amount of the cyclopentadienyl ruthenium 18 was set at about 10 mg/cc and an additive pressure of the hydrogen 19 was set at about 0.2 MPa; and the ruthenium thin film 21 was formed, in accordance with the method for selectively forming an electric conductor described in the first embodiment, on the third silicon substrate 16c. As is evident from a photograph shown in FIG. 11C, the ruthenium thin film 21 is hardly deposited anywhere on a surface of the third silicon substrate 16c as well as each of the recess 15 and the vicinity of an opening thereof. Therefore, the deposition situation of the ruthenium thin film 21 is poor. Concurrently, it is impossible to determine the shape sensitivity of the ruthenium thin film 21.

Figure 11D:
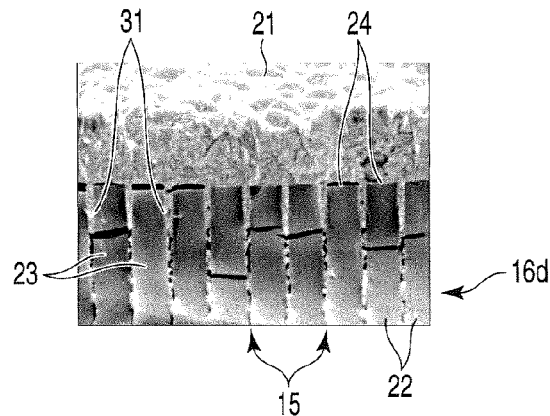

Next, FIG. 11D shows a result obtained by carrying out experiments in which an amount of the cyclopentadienyl ruthenium 18 was set at about 10 mg/cc and an additive pressure of the hydrogen 19 was set at about 0.2 MPa; and the ruthenium thin film 21 was formed, in accordance with the method for selectively forming an electric conductor described in the first embodiment, on the fourth silicon substrate 16d. As is evident from a photograph shown in FIG. 11D, the ruthenium thin film 21 is deposited while the recesses 15 each are embedded (filled up) with almost no gap, and the deposition situation of the ruthenium thin film 21 is good. However, the ruthenium thin film 21 is fully deposited in a thick shape on a surface of the fourth silicon substrate 16d as well as each of the recess 15 and the vicinity of an opening thereof. Concurrently, it is impossible to determine the shape sensitivity of the ruthenium thin film 21.

FIG. 13 collectively shows as a table the results of experiments according to the present embodiment described with reference to FIGS. 9A to 9D, FIGS. 10A to 10D, and FIGS. 11A to 11D. Each circle mark (○) in FIG. 13 denotes a good result; each delta mark (Δ) in FIG. 13 denotes a mediocre result; and each cross mark (X) in FIG. 13 denotes a bad result. From the results shown in FIG. 13, it was found that, as the larger amount of the cyclopentadienyl ruthenium (Ru(Cp)$_2$) 18 is used, the shape sensitivity of the ruthenium thin film 21 is improved more remarkably. In addition, it was also found that, if an excessively large amount of the hydrogen 19 is added, reaction of forming the ruthenium thin film 21 becomes unstable.

Further, from the results shown FIG. 13 and the photographs shown in FIGS. 9A to 9D, FIGS. 10A to 10D, and FIGS. 11A to 11D, it was found that a material for an undercoat of the ruthenium thin film 21 has almost no relationship with shape sensitivity and deposition. It was found that the material for the undercoat of the ruthenium thin film 21 influences a deposition amount of the ruthenium thin film 21. Specifically, it was found that, in the case where the material for the undercoat of the ruthenium thin film 21 is made of an electric conductor such as an Au thin film 24 or a TiN thin film 31, a deposition amount of the ruthenium thin film 21 increases significantly in comparison with a case in which the material for the undercoat of the ruthenium thin film 21 is made of an insulation film such as a SiO$_2$ film 23. Therefore, in order to increase a deposition amount of the ruthenium 21, the undercoat of the ruthenium film 21 may be formed of an electric conductor.

As has been described above, according to the second embodiment, an advantageous effect similar to that of the first embodiment described previously can be attained.

Third Embodiment

Now, a third embodiment according to the present invention will be described with reference to FIG. 14. Like constituent elements in the first and second embodiments described previously are designated by like reference numerals. A detailed description of these constituent elements is omitted here. In the present embodiment, it is assumed that a thin film made of copper (Cu) is provided as an electric conductor provided at least one recess 15 of a silicon substrate 16.

The silicon substrate used in the present embodiment is specifically the fourth silicon substrate 16d described in the second embodiment. In other words, the silicon substrate 16d used in the present embodiment, as shown in FIG. 14, is based on a configuration in which a silicon dioxide film (SiO$_2$ film) 23 serving as an insulation film is provided on a silicon layer (Si layer) 22 serving as a substrate main body. In addition, a plurality of recesses 15 with high fineness and a high aspect ratio are formed inside the silicon dioxide film 23. Each recess 15 is formed to have a width of about 100 nm and a depth of about 500 nm. In other words, an aspect ratio of each recess 15 in the present embodiment is about 5.

In addition, a titanium nitride (TiN) thin film 31 is fully coated on a surface of the silicon dioxide film 23 including an inside surface of each recess 15. Further, a gold (Au) thin film 24 is fully formed on a surface of the TiN thin film 31. The Au thin film 24 is formed on a surface of the TiN thin film 31 in accordance with a vapor deposition technique. In this manner, the working of the TiN thin film 31 is restrained and surface conductivity of an undercoat layer on which a copper (Cu) thin film 41 is provided is recovered or improved.

Diisobutyryl methanato copper (Cu(C$_7$H$_{15}$O$_2$)$_2$, Cu(dibm)$_2$) serving as one type of organic metal complex, for example, is employed as a metal compound including Cu that serves as a material for the Cu thin film 41. In addition, a pressure (whole pressure) of an internal atmosphere of a pressure-resistant reactor container 11 is set at about 13 MPa. In addition, a temperature of the internal atmosphere of the pressure-resistant reactor container 11 is set at about 230° C. In addition, an additive pressure of hydrogen 19 is set at about 0.3 MPa. Further, a processing time for forming (depositing) the Cu thin film 41 is set at about 15 minutes. Under such conditions, the method for selectively forming an electric conductor described in the first embodiment is executed.

Figure 14:
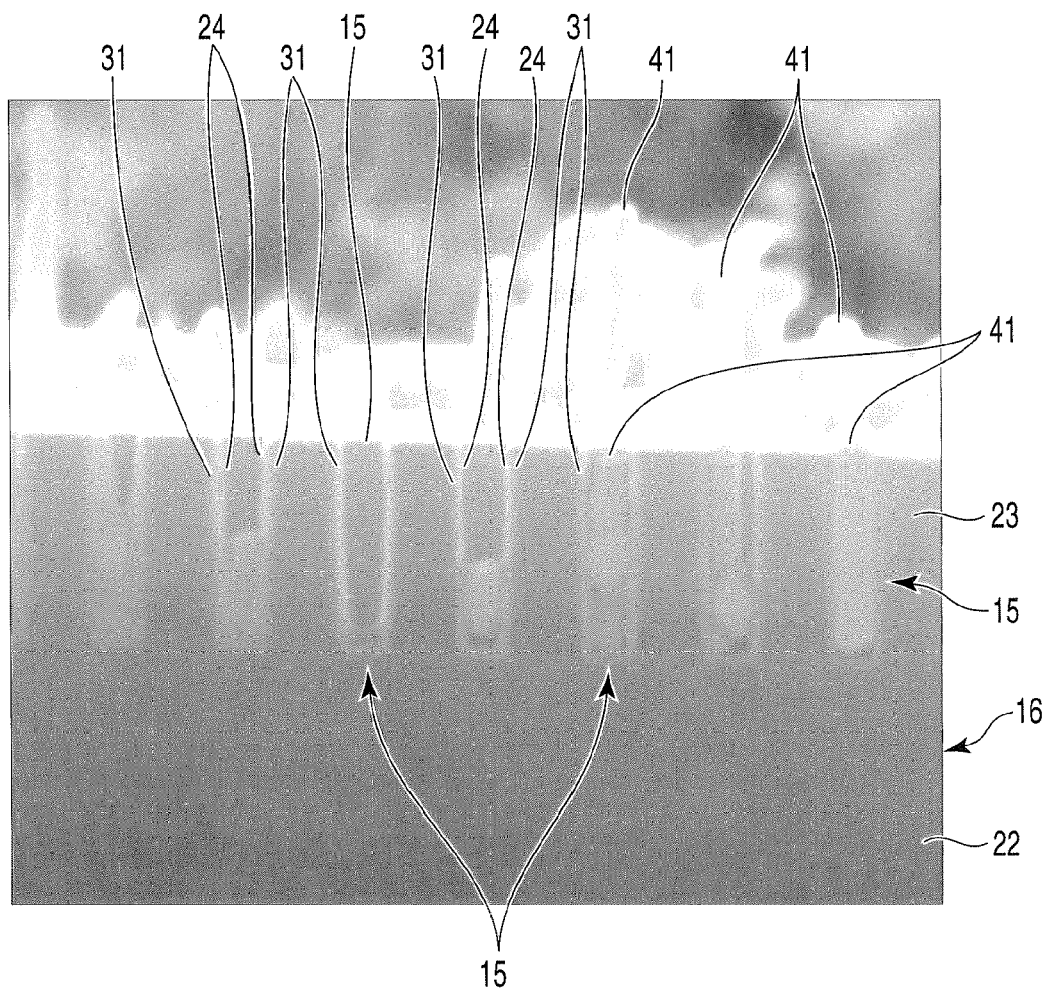
FIG. 14 is a sectional view showing, by using a SEM photograph, the vicinity of an electric conductor formed in accordance with a method for selectively forming an electric conductor according to a third embodiment.

As a result, as shown in FIG. 14, the Cu thin film 41 was successfully selectively deposited inside and above some of the recesses 15.

As has been described above, according to the third embodiment, even in the case where copper is employed instead of ruthenium, there can be attained an advantageous effect similar to those of the first and second embodiments described previously. In other words, even in the case where the Cu thin film 41 is employed, the inside of each recess 15 can be embedded (filled up) in accordance with a bottom-up film forming technique (bottom-up deposition technique) in the same manner as in the case where the Ru thin film 21 according to the first embodiment is employed.

Fourth Embodiment

Now, a fourth embodiment according to the present invention will be described with reference to FIG. 15. Like constituent elements in the first to third embodiments described previously are designated by like reference numerals. A detailed description of these constituent elements is omitted here. The present embodiment describes a technique of manufacturing a semiconductor device by using the method for selectively forming an electric conductor described in the first embodiment. Specifically, a built-in electrode of a trench capacitor is formed using the method for selectively forming an electric conductor described previously.

As shown in FIG. 15, a substrate main body of a silicon substrate 16 used in the present embodiment is composed of a P-type silicon layer (Si layer) 22. In addition, a top layer portion of this P-type silicon layer 22 serves as a P-well 51. In addition, a recess (trench) 52 with high fineness and a high aspect ratio is formed inside the P-well 51 serving as a top layer portion of the silicon substrate 16. N-type impurities are introduced into an inside top layer portion of the trench 52 in accordance with a technique such as ion implantation, and the impurities serve as a cathode 53 of a trench capacitor 58. In addition, in the trench 52, a silicon oxide film ($SiO_2$ film) 54 serving as a capacitor insulation film is provided to cover a surface of the cathode 53. Further, an element separation area 55 and an $n^+$-type impurity diffusion area 56 serving as a source area or a drain area of a transistor, although not shown, are formed at a top layer part of the silicon substrate 16.

After the silicon substrate 16 having such a structure has been contained in a pressure-resistant reactor container 11, the method for selectively forming an electric conductor described in the first embodiment is executed. At this time, in the case where the electric conductor provided in the trench 52 is formed of Ru, a processing condition may be employed such that both of deposition property and shape sensitivity are good, among the processing conditions according to the first and second embodiments described previously. In this manner, a Ru film 57 serving as a built-in electrode of the trench capacitor 58 can be selectively formed with almost no gap, at the inside and in the vicinity of an opening of the trench 52 with high fineness and a high aspect ratio. After the process for forming the Ru film 57 has been terminated, the silicon substrate 16 is removed from the inside of the pressure-resistant reactor container 11, and then, the Ru film 57 is molded in the shape of a desired built-in electrode in accordance with an etching process. In this manner, a plate electrode 57 serving as a built-in electrode formed in a desired shape is provided at the top layer portion of the silicon substrate 16 using the Ru film. As a result, the trench capacitor 58 made of the cathode 53, the capacitor insulation film 54, and the plate electrode 57 is provided at the top layer portion of the silicon substrate 16.

Then, on a surface of the silicon substrate 16 on which the trench capacitor 58 is provided, there may be provided: a word line 59 and a bit line 60; a contact plug 61 for obtaining conductivity between the bit line 60 and the impurity diffusion area 56; an inter-layered insulation film 62 and the like in accordance with a well known technique. Like the plate electrode 57, of course, the contract plug 61 may be formed in accordance with the method for selectively forming an electric conductor described in the first embodiment. A semiconductor device 63 having a structure shown in FIG. 15 is obtained in accordance with the steps described above.

As has been described above, according to the fourth embodiment, an advantageous effect similar to those of the first to third embodiments described previously can be attained. In addition, the trench capacitor 58 equipped with the plate electrode 57 having a three-dimensional, complicated shape can also be efficiently and easily formed. As a result, the semiconductor device 63 equipped with the trench capacitor 58 can be efficiently and easily manufactured. Such a semiconductor device 63 can be manufactured inexpensively because the device is good in productivity and the manufacturing step can be simplified.

Fifth Embodiment

Figure 16A:
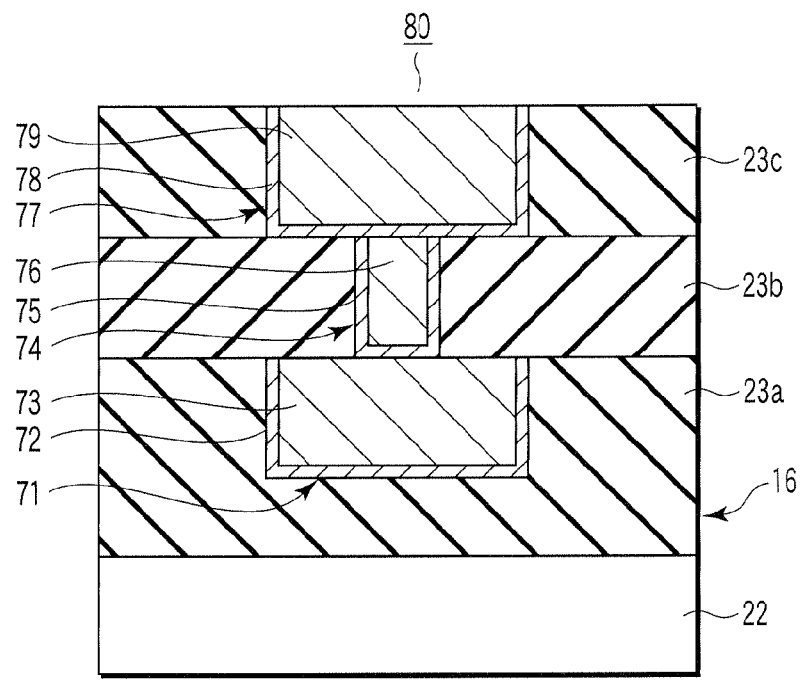
FIGS. 16A and 16B are cross sections each showing a method for manufacturing a semiconductor device according to a fifth embodiment.

Now, a fifth embodiment according to the present invention will be described with reference to FIGS. 16A and 16B. Like constituent elements in the first to fourth embodiments described previously are designated by like reference numerals. A detailed description of these constituent elements is omitted here. In the present embodiment as well, like the fourth embodiment described previously, a description will be given with respect to a technique of manufacturing a semiconductor device by using the method for selectively forming an electric conductor described in the first embodiment. However, in the present embodiment, unlike the fourth embodiment, a multi-layered wiring (interconnection) structure is formed using the method for selectively forming an electric conductor described previously.

First, a description will be given with respect to a case of forming a multi-layered wiring structure equipped with an upper layer wire made of a so-called single damascene structure, in which a wire and a plug are formed independently of each other, as shown in FIG. 16.

First, a first layer inter-layered insulation film 23a is provided on a substrate main body 22 of a silicon substrate 16 in accordance with a well-known CVD technique. Then, a lower layer wire forming recess 71 for providing a first layer wire 73 serving as a lower layer wire is formed in the first layer inter-layered insulation film 23a in accordance with a well known etching process. Then, in accordance with the CVD technique or CMP technique that are well known, a lower layer wiring barrier metal film 72 and a Cu film 73 serving as a lower layer wire are embedded (filled up) in the lower layer wire forming recess 71. In this manner, the first layer wire 73 serving as a lower layer wire is provided in the first layer inter-layered insulation film 23a.

Then, on the first layer inter-layered insulation film 23a in which the lower layer Cu wire 73 is provided, an inter-layered insulation film 23b serving as a lower layer side of a second layer inter-layered insulation film is provided in accordance with the well known CVD technique. Then, a via hole 74, for providing a via plug 76 for obtaining conductivity between the lower layer Cu wire 73 and an upper layer wire 79, is formed in a lower layer side inter-layered insulation film 23 of the second layer in accordance with the well known etching process. Then, in the well known CVD technique or the like, a via plug barrier metal film 75 is formed on a surface of the lower layer side inter-layered insulation film 23 of the second layer, including an inside surface of the via hole 74.

Then, the silicon substrate 16 having the barrier metal film 75 provided thereon is contained in a pressure-resistant reactor container 11. Then, the method for selectively forming an electric conductor described in the first embodiment is executed. At this time, in the case where the via plug 76 is formed of Cu, the processing condition according to the third embodiment described previously may be employed. In this manner, a Cu film 76 serving as a via plug can be selectively formed with almost no gap at the inside and in the vicinity of an opening of the via hole 74 with high fineness and a high aspect ratio. After the process for forming the Cu film 76 has been terminated, the silicon substrate 16 is removed from the inside of the pressure-resistant reactor container 11, and then, the Cu film 76 and the barrier metal film 75 are embedded (filled up) inside the via hole 74 in accordance with the well known CMP processing or the like. In this manner, a Cu via plug 76 is provided in the lower layer side inter-layered insulation film 23b of the second layer.

Then, on the lower layer side inter-layered insulation film 23b of the second layer having the Cu via plug 76 provided thereon, an inter-layered insulation film 23c serving as an upper layer side of the inter-layered insulation film of the second layer is provided in accordance with the well known CVD technique. Then, an upper layer wire forming recess 77 for providing an upper layer wire 79 is formed in the upper layer side inter-layered insulation film 23c of the second layer in accordance with a well known etching process or the like. Then, in accordance with a well known CVD technique or the like, the upper layer wiring barrier metal film 78 is formed on a surface of the upper layer inter-layered insulation film 23c of the second layer including the inside surface of the upper layer wire forming recess 77.

Then, the silicon substrate 16 having the barrier metal film 78 provided thereon is accommodated in the pressure-resistant reactor container 11 again. Thereafter, the method for selectively forming an electric conductor described in the first embodiment is executed. At this time, in the case where the upper layer wire 79 is formed of Cu, as is the case with forming the Cu via plug 76, the processing condition according to the third embodiment described previously may be employed. In this manner, a Cu film 79 serving as an upper layer wire can be selectively with almost no gap at the inside and in the vicinity of an opening of the fine upper layer wire forming recess 77. After the process for forming the Cu film 79 has been terminated, the silicon substrate 16 is removed from the inside of the pressure-resistant reactor container 11 again, and then, the Cu film 79 and the barrier metal film 78 are embedded (filled up) inside the upper layer wire forming recess 77 in accordance with the well known CMP processing or the like. In this manner, a second layer wire 79 formed independently of the Cu via plug 76 is provided in the upper layer side inter-layered insulation film 23c of the second layer. In other words, the upper layer Cu wire 79 made of a so-called damascene structure is provided in the upper layer side inter-layered insulation film 23c of the second layer.

In the process described above, as shown in FIG. 16A, there is obtained a semiconductor device 80 comprising a multi-layered wiring structure made of upper and lower two layers in which the upper layer Cu wire 79 and the lower layer Cu wire 73 made of a single damascene structure are made conductive via the barrier metal films 75 and 78 and the Cu via plug 76.

Figure 16B:
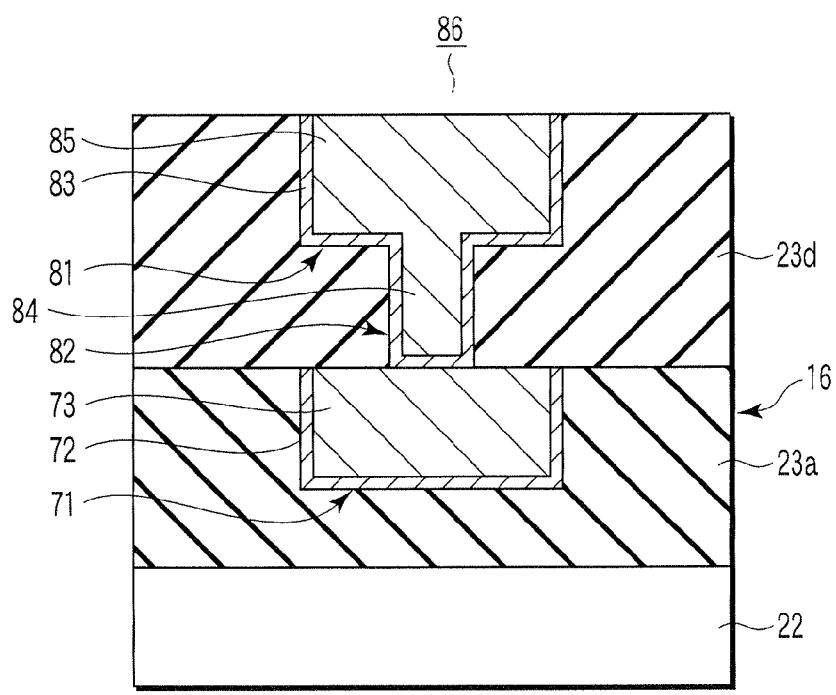

Now, a description will be given with respect to a case of forming a multi-layered wiring structure comprising an upper layer wire made of a so-called dual damascene structure in which a wire and a plug are formed integrally with each other, as shown in FIG. 16B.

First, a lower layer Cu wire 73 is provided in a first layer inter-layered insulation film 23a in accordance with a process similar to the case of manufacturing the semiconductor device 80 described previously.

Then, on the first layer inter-layered insulation film 23a having the lower layer Cu wire 73 provided thereon, a second layer inter-layered insulation film 23d is provided in accordance with a well known CVD technique. Then, a via hole 82, for providing a via plug for obtaining conductivity between each of an upper layer wire forming recess 81 for providing an upper layer wire and an upper layer wire and the lower layer Cu wire 73, is integrally formed to communicate with each other in the second layer inter-layered insulation film 23d in accordance with the well known etching process or the like. Then, by a well known CVD technique or the like, an upper layer wire barrier metal film 83 is formed on a surface of the second layer inter-layered insulation film 23d including an inside surface of the via hole 82.

Then, the silicon substrate 16 having the barrier metal film 83 provided thereon is accommodated in the pressure-resistant reactor container 11. Then, the method for selectively forming an electric conductor described in the first embodiment is executed. At this time, in the case where the upper layer wire and the via plug are formed of Cu, as is the case with manufacturing the semiconductor device 80 described previously, the processing condition according to the third embodiment may be employed. In this manner, a Cu film serving as a via plug and an upper layer wire can be selectively formed with almost no gap at the inside of the via hole 82 and the upper layer wire forming recess 81 with high fineness and a high aspect ratio and at the periphery of an opening of the upper layer wire forming recess 81. After the process for forming the Cu film has been terminated, the silicon substrate 16 is removed from the inside the pressure-resistant reactor container 11, and then, the Cu film and the barrier metal film 83 are embedded (filled up) inside of the via hole 82 and the upper layer wire forming recess 81 in accordance with a well known CMP process. In this manner, a second layer wire 85 formed integrally with a Cu via plug 84 is provided in the second layer inter-layered insulation film 23d. In other words, the upper layer Cu wire 85 made of a so-called dual damascene structure is provided in the second layer inter-layer insulation film 23d.

In accordance with the process described above, as shown in FIG. 16B, there is obtained a semiconductor device 86 comprising a multi-layered wiring structure made of upper and lower two layers in which the upper layer Cu wire 85 and the lower layer Cu wire 73 made of a dual damascene structure are made conductive via the barrier metal films 72 and 83 and the Cu via plug 84.

As has been described above, according to the fifth embodiment, there can be attained an advantageous effect similar to those of the first to fourth embodiments described previously. In addition, like the upper layer Cu wires 79 and 85 and the Cu via plugs 76 and 84, of course, the lower layer Cu wire 73 may also be formed in accordance with the method for selectively forming an electric conductor described in the first embodiment.

The method for selectively forming an electric conductor and the method for manufacturing a semiconductor device according to the present invention are not restricted to the first to fifth embodiments described previously. The above methods according to the present invention can be carried out by changing their configurations or part of the manufacturing process to a variety of settings or by properly and adequately using the variety of settings in combination, without deviating from the spirit of the invention.

For example, a method for excessively dissolving liquid cyclopentadienyl ruthenium 18a in carbon dioxide serving as a supercritical fluid is not limited to only a method for mixing hydrogen 19 in carbon dioxide that serves as a supercritical fluid employed in the first embodiment. By increasing a preparation amount of cyclopentadienyl ruthenium 18 with respect to an internal capacity of the pressure-resistant reactor container 11, the liquid cyclopentadienyl ruthenium 18a may be excessively dissolved in carbon dioxide that serves as a supercritical fluid. In this case, prior to carrying out a process for selectively forming an electric conductor according to the present invention, excessive cyclopentadienyl ruthenium 18 may be contained in advance in the pressure-resistant reactor container 11.

In the first, second, and fourth embodiments, the ruthenium thin film 21 discussed as a so-called glue film was formed as an electric conductor provided in each recess 15. In addition, in the third and fifth embodiments, the Cu thin films 41, 76, 79, 84, and 85 were formed as electric conductors provided in the recesses 15. However, the electric conductor provided in each of the recess 15 is not always limited to ruthenium or copper. The electric conductor provided in each of the recess 15 may be an electric conductor consisting essentially of a metal belonging to a platinum group other than ruthenium. Specifically, an electric conductor consisting essentially of platinum (Pt), palladium (Pd), iridium (Ir), rhodium (Rh), or osmium (Os) can be provided in each of the recess 15 by the process for selectively forming an electric conductor according to the present invention.

Further, an organic metal complex (precursor) including ruthenium 20, 21 is not limited to the cyclopentadienyl ruthenium ($Ru(C_5H_5)_2$, $RuCp_2$) 18 described previously. Even if organic Ru compounds or oxygen-containing Ru complex such as RuCpMe, $Ru(C_5HF_6O_2)_2$, $Ru(C_{11}H_{19}O_2)_3$ other than cyclopentadienyl ruthenium 18 are employed as an organic metal complex including ruthenium 20, 21, there can be attained an advantageous effect similar to those of the first, second, and fourth embodiments. Similarly, organic metal complex including Cu41 is not limited to diisobutyryl methanato copper ($Cu(C_7H_{15}O_2)_2$, $Cu(dimb)_2$) described previously. Even if $Cu^{+2}$(hexafluoro acetyl acetonate)$_2$, $Cu^{+2}$(acetyl acetonate)$_2$, $Cu^{2+}$ (2,2,6,6-tetramethyl-3,5-heptandione)$_2$ or the like other than diisobutyryl methanato copper is employed as organic metal complex including Cu41, there can be attained an advantageous effect similar to those of the third and fifth embodiments. In addition, in these metal compounds (organic metal complexes) including metals serving as a main component of the electric conductors, a phase (state) before processed does not always need to be a solid phase (solid). The phase (state) before processing of a metal compound including a metal serving as a main component of an electric conductor may be a liquid phase (liquid).

In addition, the electric conductor provided in each recess 15 is not always limited to an elemental metal made of a single metal such as ruthenium or copper. For example, the electric conductor provided in each recess 15 may be an alloy made of two or more kinds of metals. The electric conductor provided in each recess 15 may contain at least one kind of metal and may have electric conductivity. For example, in the method for selectively forming an electric conductor according to the present invention, an organic metal complex serving as a metal compound including copper and an organic metal complex serving as a metal compound including aluminum are dissolved in carbon dioxide serving as a supercritical fluid. By doing this, it is possible to provide an alloy made of copper and aluminum in each recess 15.

A material for the supercritical fluid is not limited to carbon dioxide. Other materials for the supercritical fluid can include, for example, ethane ($C_2H_6$), dinitrogen monoxide ($N_2O$), butane ($C_3H_8$), ammonia ($NH_3$), hexane ($C_6H_{14}$), methanol ($CH_3OH$), ethanol ($C_2H_5OH$), and water ($H_2O$). Among these materials, ethane ($C_2H_6$) is such that a critical temperature at which a supercritical fluid is obtained is about 32° C. and a critical pressure is about 4.9 MPa. In addition, dinitrogen monoxide ($N_2O$) is such that a critical temperature at which a supercritical fluid is obtained is about 36° C. and a critical pressure is about 7.2 MPa. In other words, ethane ($C_2H_6$) and dinitrogen monoxide ($N_2O$) are provided as materials that can be easily handled in the same manner as carbon dioxide.

An amount of cyclopentadienyl ruthenium 18a to be dissolved in carbon dioxide serving as a supercritical fluid may not be established in the excessively saturated state described previously. An amount of cyclopentadienyl ruthenium 18a to be dissolved in carbon dioxide serving as a supercritical fluid may be set in a sub-saturated or in a saturated state depending on a desired precipitation rate of ruthenium 20.

Hydrogen 19 serving as a substance of promoting precipitation of ruthenium 20 does not always need to be mixed in carbon dioxide serving as a supercritical fluid. Instead of mixing hydrogen 19 in carbon dioxide serving as a supercritical fluid, as described in the first embodiment, a fluctuation may be caused to occur in the density of the supercritical fluid by changing and making non-uniform at least one of the temperature and the pressure of the internal atmosphere of the pressure resistance reactor container 11. In accordance with such a method as well, the density of the supercritical fluid is made non-uniform and a density fluctuation is caused to occur so that precipitation of ruthenium 20 from cyclopentadienyl ruthenium 18a can be promoted. Alternatively, such a method and mixing of hydrogen 19 into the supercritical fluid may be used together.

The method for causing a fluctuation in the density of the supercritical fluid by changing and making non-uniform the temperature of the atmosphere in the pressure-resistant reactor container 11 is not limited to the method for actuating the upper, middle, and lower mantle heaters 14a, 14b, and 14c independently of each other described in the first embodiment. For example, the pressure-resistant reactor container 11 per se is displaced from a center position in a vertical direction in default settings of the pressure-resistant reactor container 11 and the mantle heater 14 indicated by the alternate single dot and chain line A-A' in FIG. 1, whereby the pressure-resistant reactor container 11 may be heated eccentrically by means of the mantle heater 14. In accordance with such a method as well, there can be attained an advantageous effect similar to a case in which the upper, middle, and lower mantle heaters 14a, 14b, and 14c are actuated independently of each other.

A timing of mixing hydrogen 19 into a supercritical fluid does not always need to be set in parallel to a process for dissolving cyclopentadienyl ruthenium 18a in carbon dioxide that serves as a supercritical fluid. For example, after the inside of each recess 15 has been temporarily filled with cyclopentadienyl ruthenium 18a, hydrogen 19 may be mixed in the supercritical fluid.

In addition, an exemplary application of the method for selectively forming an electric conductor according to the present invention is not limited to the method for manufacturing a semiconductor device described in the fifth embodiment. Another exemplary application of the method for selectively forming an electric conductor according to the present invention can include a method for manufacturing a high-density magnetic recording medium (nano-dot magnetic recording medium) or a nonlinear optical element. Alternatively, the method for selectively forming an electric conductor according to the present invention, of course, can be applied to a step of forming a seed film made of an electric conductor serving as a base of wiring in a recess such as a trench, a groove, a hole, or a pore with high fineness and a high aspect ratio, in a step of forming fine wires inside a fine semiconductor element such as CMOS.

Further, while a specific and detailed description with illustration is omitted here, according to the experiments carried out by the inventors, by use of the method for selectively forming an electric conductor according to the present invention, it was found possible to selectively provide an electric conductor inside a very fine recess of which a width is equal to or smaller than 10 nm as well as a recess of which a width is about 100 nm. In other words, with the method for selectively forming an electric conductor according to the present invention, it was found possible to efficiently and easily embed (fill up) an electric conductor in a compact manner, at the inside of a recess with very high fineness and a high aspect ratio, which cannot be virtually embedded (filled up) in a compact manner in accordance with the conventional CVD or PVD technique. In other words, it was found that the method for selectively forming an electric conductor according to the present invention can be properly applied to a process for manufacturing various elements or devices that require electric conductors, each of which has a further fine, complicated structure or shape.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method for selectively forming an electric conductor, the method comprising:
    disposing a processing target and a metal compound in an atmosphere including a supercritical fluid, the processing target having formed thereon at least one recess for providing an electric conductor, the metal compound including a metal serving as a main component of the electric conductor, and dissolving at least part of the metal compound in the supercritical fluid;
    selectively introducing the metal compound dissolved in the supercritical fluid into the recess in contact with a surface of the processing target, and coagulating in the recess the metal compound introduced into the recess to precipitate the metal from the metal compound; and
    coagulating the metal precipitated in the recess, thereby providing the electric conductor in the recess;
    wherein the metal compound of a solid phase is disposed in the atmosphere and the metal compound of the solid phase is fused and changed to a liquid phase to dissolve part of the metal compound in the liquid phase in the supercritical fluid;
    wherein the liquid phase of the metal compound and the supercritical fluid coexist in the atmosphere in a state in which they are separated from each other, with part of the metal compound of the liquid phase dissolved in the supercritical fluid;
    wherein a density of the supercritical fluid is made non-uniform and a cyclic pulsing of the density of the supercritical fluid is generated, thereby promoting precipitation of the metal from the metal compound; and
    wherein at least one of a temperature and a pressure of the atmosphere is periodically changed at predetermined intervals and made non-uniform, thereby generating the cyclic pulsing of the density of the supercritical fluid.

2. The method according to claim 1, wherein a temperature and a pressure of the atmosphere are increased, thereby fusing the metal compound and changing the fused metal compound from a solid phase to a liquid phase.

3. The method according to claim 1, wherein the supercritical fluid is removed from an inside of the atmosphere, thereby coagulating the metal precipitated in the recess.

4. The method according to claim 1, wherein at least one of a temperature and a pressure of the atmosphere is reduced, thereby coagulating the metal precipitated in the recess.

5. The method according to claim 1, wherein an organic metal complex is employed as the metal compound.

6. The method according to claim 1, wherein a metal belonging to a platinum group is employed as the metal.

7. The method according to claim 6, wherein at least one of platinum (Pt), palladium (Pd), iridium (Ir), rhodium (Rh), osmium (Os), and ruthenium (Ru) is employed as the metal belonging to the platinum group.

8. The method according to claim 1, wherein copper (Cu) is employed as the metal.

9. The method according to claim 1, wherein carbon dioxide is employed as a material for the supercritical fluid.

10. The method according to claim 1, wherein the metal compound is dissolved in the supercritical fluid until the metal compound is established in a sub-saturated or saturated state with respect to the supercritical fluid.

11. The method according to claim 1, wherein the metal is precipitated in the recess while an inside of the recess is sequentially filled with the metal compound from a bottom part to an upper part thereof.

12. The method according to claim 1, wherein the metal is precipitated in the recess until an inside of the recess is filled with the metal.

13. The method according to claim 1, wherein introduction of the metal compound into the recess and precipitation of the metal from the metal compound are promoted in parallel to each other.

14. The method according to claim 1, further comprising: introducing into the atmosphere, a substance for promoting precipitation of the metal from the metal compound.

15. The method according to claim 14, wherein, after an inside of the recess is filled with the metal compound, a substance for promoting precipitation of the metal from the metal compound is introduced into the atmosphere.

16. The method according to claim 14, wherein a substance for increasing a saturation dissolving degree of the metal compound with respect to the supercritical fluid is introduced into the atmosphere as the substance for promoting precipitation of the metal from the metal compound.

17. The method according to claim 14, wherein a substance functioning as a reducing agent with respect to the metal compound is introduced into the atmosphere as the substance for promoting precipitation of the metal from the metal compound.

18. The method according to claim 14, wherein hydrogen is introduced into the atmosphere as the substance for promoting precipitation of the metal from the metal compound.

19. The method according to claim 1, wherein, among the processing target, at least an inside surface of the recess is formed from another electric conductor independent of the electric conductor.

20. The method according to claim 1, wherein the pressure of the atmosphere is periodically changed at predetermined intervals and made non-uniform, thereby generating the cyclic pulsing of the density of the supercritical fluid.

21. The method according to claim 20, wherein the temperature of the atmosphere is constant during generating the cyclic pulsing of the density of the supercritical fluid.

22. A method for manufacturing a semiconductor device, the method comprising:

disposing, in an atmosphere including a supercritical fluid, a semiconductor substrate having formed thereon at least one recess for providing an electric conductor on at least one of a substrate main body and an insulation film provided above the substrate main body and a metal compound including a metal serving as a main component of the electric conductor, and dissolving at least part of the metal compound in the supercritical fluid;

selectively introducing the metal compound dissolved in the supercritical fluid into the recess in contact with a surface of the semiconductor substrate, and coagulating in the recess the metal compound introduced into the recess to precipitate the metal from the metal compound; and coagulating the metal precipitated in the recess, thereby providing the electric conductor in the recess;

wherein the metal compound of a solid phase is disposed in the atmosphere and the metal compound of the solid phase is fused and changed to a liquid phase to dissolve part of the metal compound in the liquid phase in the supercritical fluid;

wherein the liquid phase of the metal compound and the supercritical fluid coexist in the atmosphere in a state in which they are separated from each other, with part of the metal compound of the liquid phase dissolved in the supercritical fluid;

wherein a density of the supercritical fluid is made non-uniform and a cyclic pulsing in the density of the supercritical fluid is generated, thereby promoting precipitation of the metal from the metal compound; and wherein at least one of a temperature and a pressure of the atmosphere is periodically changed at predetermined intervals and made non-uniform, thereby generating the cyclic pulsing in the density of the supercritical fluid.

23. The method according to claim 22, wherein the electric conductor is provided in the recess formed at a top layer portion of the substrate main body, and then, a built-in electrode of a trench capacitor is formed at the top layer portion of the substrate main body.

24. The method according to claim 22, wherein the electric conductor is provided in the recess formed in the insulation film provided above the substrate main body, and then, at least one of a wire and a plug is formed in the insulation film.

* * * * *